U S011824145B2

(12) United States Patent
Lee et al.

(10) Patent No.: US 11,824,145 B2
(45) Date of Patent: Nov. 21, 2023

(54) LIGHT EMITTING DEVICE AND DISPLAY APPARATUS INCLUDING THE SAME

(71) Applicant: SEOUL VIOSYS CO., LTD., Ansan-si (KR)

(72) Inventors: Chung Hoon Lee, Ansan-si (KR); Sung Su Son, Ansan-si (KR); Jong Ik Lee, Ansan-si (KR); Jae Hee Lim, Ansan-si (KR); Motonobu Takeya, Ansan-si (KR); Seung Sik Hong, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 17/509,050

(22) Filed: Oct. 24, 2021

(65) Prior Publication Data

US 2022/0115568 A1    Apr. 14, 2022

Related U.S. Application Data

(63) Continuation of application No. 16/646,537, filed as application No. PCT/KR2018/011425 on Sep. 27, 2018, now Pat. No. 11,641,008.

(30) Foreign Application Priority Data

Sep. 29, 2017    (KR) .......................... 10-2017-0127133
Nov. 23, 2017    (KR) .......................... 10-2017-0157669
Sep. 21, 2018    (KR) .......................... 10-2018-0113679

(51) Int. Cl.
*H01L 33/50*    (2010.01)
*H01L 25/075*   (2006.01)
*H01L 33/62*    (2010.01)

(52) U.S. Cl.
CPC ........ *H01L 33/504* (2013.01); *H01L 25/0753* (2013.01); *H01L 33/62* (2013.01)

(58) Field of Classification Search
CPC ... H01L 33/504; H01L 25/0753; H01L 33/62; H01L 33/44; H01L 27/156; H01L 33/50;
(Continued)

(56) References Cited

U.S. PATENT DOCUMENTS 6,995,402 B2    2/2006    Ludowise et al.
7,573,628 B2    8/2009    Inoguchi
(Continued)

FOREIGN PATENT DOCUMENTS

CN    1776908    5/2006
CN    1860828    11/2006
(Continued)

OTHER PUBLICATIONS

International Search Report dated Jan. 7, 2019, issued in International Application No. PCT/KR2018/011425.
(Continued)

*Primary Examiner* — Ratisha Mehta
(74) *Attorney, Agent, or Firm* — H.C. Park & Associates, PLC

(57) ABSTRACT

A display apparatus including a substrate, a first sub-pixel, a second sub-pixel, and a third sub-pixel disposed on the substrate and configured to emit red light, green light, and blue light, respectively, partition walls disposed between the first sub-pixel, the second sub-pixel, and the third sub-pixel, and configured to not transmit light, in which the first sub-pixel, the second sub-pixel, and the third sub-pixel include a first light emitting cell, a second light emitting cell, and a third light emitting cell, respectively, and a height of each of the first, second, and third light emitting cells is lower than a height of the partition walls, and a difference between the height of the partition walls and the height of each of the first, second, and third light emitting cells is less than 100 μm.

22 Claims, 19 Drawing Sheets

(58) Field of Classification Search
CPC ......... G09G 2300/0452; G09G 3/2096; G09G 3/3233
See application file for complete search history.

(56) References Cited

U.S. PATENT DOCUMENTS

| | | | |
|---|---|---|---|
| 7,923,917 | B2 | 4/2011 | Eida et al. |
| 8,456,080 | B2 | 6/2013 | Matsuo et al. |
| 10,151,434 | B2 | 12/2018 | Ogata et al. |
| 10,153,260 | B2 | 12/2018 | Yeon et al. |
| 10,603,142 | B2 | 3/2020 | Ueno et al. |
| 10,950,583 | B2 | 3/2021 | Moon et al. |
| 11,121,172 | B2 | 9/2021 | Lee et al. |
| 2006/0083281 | A1 | 4/2006 | Inogichi |
| 2006/0267037 | A1 | 11/2006 | Lim et al. |
| 2007/0121129 | A1 | 5/2007 | Eida et al. |
| 2009/0108271 | A1* | 4/2009 | Chou .................. H01L 25/0753 257/E33.056 |
| 2012/0087108 | A1 | 4/2012 | Ke et al. |
| 2013/0112960 | A1 | 5/2013 | Chaji et al. |
| 2015/0295150 | A1* | 10/2015 | Lin ......................... H01L 33/22 257/99 |
| 2016/0065954 | A1* | 3/2016 | Son ........................ G02B 30/52 348/51 |
| 2016/0133675 | A1* | 5/2016 | Yata .................... H10K 59/353 257/89 |
| 2016/0195770 | A1* | 7/2016 | Fukai ................ G02F 1/133606 362/311.01 |
| 2016/0293811 | A1 | 10/2016 | Hussell et al. |
| 2016/0372514 | A1 | 12/2016 | Chang et al. |
| 2016/0372528 | A1* | 12/2016 | Kamura ................ H01L 31/055 |
| 2017/0062674 | A1 | 3/2017 | Kwon et al. |
| 2017/0097541 | A1* | 4/2017 | Kim ...................... G02F 1/1337 |
| 2017/0104042 | A1 | 4/2017 | Wang et al. |
| 2017/0200765 | A1 | 7/2017 | Choi et al. |
| 2017/0250316 | A1 | 8/2017 | Yeon et al. |
| 2017/0263828 | A1 | 9/2017 | Mao et al. |
| 2017/0336690 | A1* | 11/2017 | Lee .................... H01L 25/0753 |
| 2018/0088261 | A1 | 3/2018 | Song et al. |
| 2018/0088404 | A1 | 3/2018 | Chae et al. |
| 2018/0351054 | A1* | 12/2018 | Chen ................... H01L 33/508 |
| 2020/0013990 | A1 | 1/2020 | Ueda |
| 2020/0357846 | A1 | 11/2020 | Lee et al. |

FOREIGN PATENT DOCUMENTS

| | | |
|---|---|---|
| CN | 102427075 | 4/2012 |
| CN | 107134469 | 9/2017 |
| EP | 2128689 | 12/2009 |
| EP | 3709364 | 9/2020 |
| JP | 09-148629 | 6/1997 |
| JP | 11-024607 | 1/1999 |
| JP | 11-162233 | 6/1999 |
| JP | 2002-217454 | 8/2002 |
| JP | 2002217454 | 8/2002 |
| JP | 2005-117039 | 4/2005 |
| JP | 2005-235566 | 9/2005 |
| JP | 2006-114854 | 4/2006 |
| JP | 2006-339641 | 12/2006 |
| JP | 2008-129043 | 6/2008 |
| JP | 2009-177117 | 8/2009 |
| JP | 2009-206466 | 9/2009 |
| JP | 2010-044118 | 2/2010 |
| JP | 2012-119476 | 6/2012 |
| JP | 2013-037139 | 2/2013 |
| JP | 2016-122606 | 7/2016 |
| JP | 2016122606 | 7/2016 |
| JP | 2017-163001 | 9/2017 |
| KR | 10-2013-0088556 | 8/2013 |
| KR | 10-2014-0134038 | 11/2014 |
| KR | 10-2017-0108623 | 9/2017 |
| KR | 2017-0108623 | 9/2017 |
| WO | 2005/034582 | 4/2005 |
| WO | 2016/152321 | 9/2016 |
| WO | 2016161161 | 10/2016 |
| WO | 2017034379 | 3/2017 |
| WO | 2019093533 | 5/2019 |

OTHER PUBLICATIONS

Extended European Search Report dated May 19, 2021, issued in European Patent Application No. 18861552.0.
Non-Final Office Action dated Oct. 5, 2021, in U.S. Appl. No. 16/646,537.
Final Office Action dated Apr. 15 2022, in U.S. Appl. No. 16/646,537.
Office Action dated Jun. 23, 2022 from the Japanese Patent Office for Japanese Patent Application No. 2020-515261 (with English concise explanation).
Non-Final Office Action dated Aug. 4, 2022, issued to U.S. Appl. No. 16/646,537.
Office Action dated Oct. 25, 2022, issued to Japanese Patent Application No. 2021-165398.
Notice of Allowance dated Nov. 9, 2022, issued to U.S. Appl. No. 16/646,537.
Office Action dated Apr. 1, 2023, issued to Chinese Patent Application No. 201911354437 (with English Concise Explanation).
Office Action dated Apr. 3, 2023 from the Chinese Patent Office for Chinese Patent Application No. 201880037296 (with English Concise Explanation).
Office Action dated Jun. 10, 2023 from the Korean Patent Office for Korean Patent Application No. 10-2018-0113679 (with English Translation).
Japanese Office Action issued for corresponding Japanese Patent Application No. 2020-515261 dated Jul. 4, 2023 (with English Translation).

* cited by examiner

LIGHT EMITTING DEVICE AND DISPLAY APPARATUS INCLUDING THE SAME

CROSS-REFERENCE TO RELATED APPLICATIONS

This application is a Continuation of U.S. patent application Ser. No. 16/646,537, filed on Mar. 11, 2020, which is a National Stage Entry of International Patent Application No. PCT/KR2018/011425, filed on Sep. 27, 2018, and claims priority from and the benefit of Korea Patent Application No. 10-2017-0127133, filed on Sep. 29, 2017, Korea Patent Application No. 10-2017-0157669, filed on Nov. 23, 2017, and Korea Patent Application No. 10-2018-0113679, filed on Sep. 21, 2018, each of which is hereby incorporated by reference for all purposes as if fully set forth herein.

BACKGROUND

Field

Exemplary embodiments of the invention relates to a light emitting device and a display apparatus including the same.

Discussion of the Background

Among light emitting devices, a light emitting diode is an inorganic light source, and is used in various fields, such as a display device, a vehicle lamp, and general lighting. The light emitting diode has long life, low power consumption, and fast response time, and thus, is rapidly replacing a conventional light source.

A conventional light emitting diode has been mainly used as a backlight light source in a display device. However, recently, a micro light emitting diode have been developed as a next generation display device that directly implements an image using the light emitting diode.

In general, the display device implements various colors using a mixed color of blue, green, and red. Each pixel of the display device includes sub-pixels of blue, green, and red, and a color of a specific pixel is determined through the color of these sub-pixels, and an image is implemented by a combination of these pixels.

In a micro LED display device, the micro LED is disposed to correspond to each sub-pixel, and accordingly, a large number of micro LEDs needs to be disposed on one substrate. The micro LED is very small, and has a size of less than about 200 micrometers and even less than 100 micrometers, and thus, various problems may be caused due to its small size. In particular, due to its small size, mounting the light emitting diode on a panel is difficult, and it is also difficult to replace a defective LED, among the mounted micro LEDs, with a good LED.

In general, a light emitting diode may emit ultraviolet light or blue light, and may be combined with a phosphor to implement green light and red light. In addition, a color filter is used for each sub-pixel to improve purity of each color, and each color filter also differs in filter efficiency. Accordingly, even when the same light emitting diode is operated to emit light of the same intensity, a light intensity may be different for a blue sub-pixel, a green sub-pixel, and a red sub-pixel. In order to overcome this difference, operating current density of each light emitting diode may be changed. In this case, however, light emitting efficiency of the light emitting diode may be decreased due to the change in the current density.

The above information disclosed in this Background section is only for understanding of the background of the inventive concepts, and, therefore, it may contain information that does not constitute prior art.

SUMMARY

Light emitting diodes constructed according to exemplary embodiments of the invention are capable of being easily mounted and replaced, and a display apparatus having the same.

Exemplary embodiments also provide a light emitting diode in which each light emitting diode of each sub-pixel operates at an optimal luminous efficiency, and a display apparatus having the same.

Exemplary embodiments also provide a display apparatus with high color purity and high color reproducibility.

Additional features of the inventive concepts will be set forth in the description which follows, and in part will be apparent from the description, or may be learned by practice of the inventive concepts.

A light emitting device according to an exemplary embodiment includes a first light emitting cell, a second light emitting cell, and a third light emitting cell each including a first conductivity type semiconductor layer, an active layer, and a second conductivity type semiconductor layer, pads electrically connected to the first, second, and third light emitting cells, a first wavelength converter configured to convert a wavelength of light emitted from the first light emitting cell into a first wavelength, and a second wavelength converter configured to convert a wavelength of light emitted from the second light emitting cell into a second wavelength shorter than the first wavelength, in which the first light emitting cell has a larger area than the third light emitting cell, and the second light emitting cell has a larger area than the first light emitting cell.

Each of the first, second, and third light emitting cells may be configured to emit blue light, light having the first wavelength may be green light, and light having the second wavelength may be red light.

Area ratios of the first light emitting cell and the second light emitting cell with regard to the third light emitting cell may be inversely proportional to light conversion efficiency of the first wavelength converter and light conversion efficiency of the second wavelength converter, respectively.

The light emitting device may further include a third wavelength converter configured to convert a wavelength of light emitted from the third light emitting cell into a third wavelength shorter than the first wavelength, in which the first, second, and third light emitting cells may be configured to emit ultraviolet light.

Light having the first wavelength may be green light, light having the second wavelength may be red light, and light having the third wavelength may be blue light.

Area ratios of the first light emitting cell and the second light emitting cell with regard to the third light emitting cell may be inversely proportional to a light conversion efficiency ratio of the first wavelength converter and a light conversion efficiency ratio of the second wavelength converter with regard to the third wavelength converter, respectively.

The light emitting device may further include a first color filter disposed on the first wavelength converter, a second color filter disposed on the second wavelength converter, and a third color filter disposed on the third wavelength converter.

The light emitting device may further include a second color filter disposed on the second wavelength converter, and a third color filter disposed on the third wavelength converter.

The light emitting device may further include a substrate on which the first, second, and third light emitting cells are disposed.

The light emitting device may further include partition walls disposed between each of the first, second, and third light emitting cells and configured to not transmit light, in which a height of each of the first, second, and third light emitting cells may be lower than a height of each partition wall, and a distance between the partition walls and the first, second, and third light emitting cells may be less than about 20 μm.

The partition walls provided between the first light emitting cell, the second light emitting cell, and the third light emitting cell may be integrally connected to each other.

A width of each partition wall may increase as the partition wall is disposed further away from the substrate.

A ratio of an area occupied by the partition walls in a planar area of the substrate may be 0.5 to 0.99.

A height of each partition wall may be in a range of about 15 μm to about 115 μm.

The first, second, and third light emitting cells may be configured to emit green light, blue light, and red light, respectively, a distance between the first light emitting cell and the second light emitting cell may be equal to a distance between the first light emitting cell and the third light emitting cell.

The distance between the first light emitting cell and the second light emitting cell may be different from a distance between the first light emitting cell and the third light emitting cell.

The first, second, and third light emitting cells may be provided in one pixel, and a distance between the second and third light emitting cells provided in the one pixel may be shorter than a distance between the second light emitting cell and any one of the light emitting cells provided in an adjacent pixel.

The first, second, and third light emitting cells may be arranged in substantially a triangular shape.

The first, second, and third light emitting cells may be arranged along a straight line.

The first conductivity type semiconductor layers of the first, second, and third light emitting cells may be connected to each other.

The light emitting device may further include an extension part extending from a pad electrically connected to the first conductivity type semiconductor layer.

The light emitting device may further include a film including the first and second wavelength converters.

The light emitting device may further include a film including a plurality of laminated layers, in which the first and second wavelength converters may be disposed on different laminated layers.

A light emitting device according to another exemplary embodiment includes a substrate, a first light emitting cell, a second light emitting cell, and a third light emitting cell respectively disposed on the substrate and configured to respectively emit red light, green light, and blue light, and partition walls disposed between of the first light emitting cell, the second light emitting cell, and the third light emitting cell, respectively, and configured to not transmit light, in which a height of each of the first, second, and third light emitting cells is lower than a height of each partition wall, and a distance between the partition walls and the first, second, and third light emitting cells is less than about 5 μm.

A display apparatus may include a circuit board, and a plurality of pixels arranged on the circuit board, in which each of the plurality of pixels may include the light emitting device according to an exemplary embodiment.

It is to be understood that both the foregoing general description and the following detailed description are exemplary and explanatory and are intended to provide further explanation of the invention as claimed.

DETAILED DESCRIPTION

Figure 1:
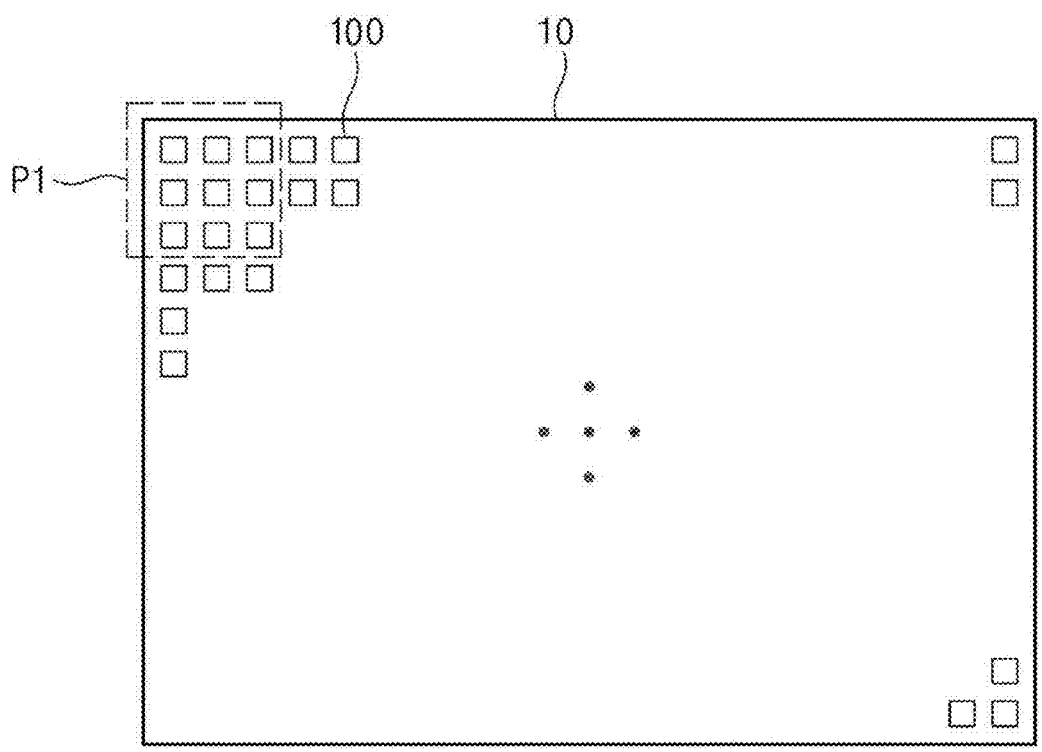
FIG. 1 is a plan view of a display apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Exemplary embodiments of the invention relate to a light emitting device that emits light, which may be used as a light source in various devices, such as in a display apparatus to function as a pixel. Hereinafter, a display apparatus will be described first, and a light emitting device employed in the display apparatus as a pixel will be described according to exemplary embodiments with reference to the drawings. However, the inventive concepts are not limited thereto, and the light emitting device may be employed as a light source in other devices.

Figure 2:
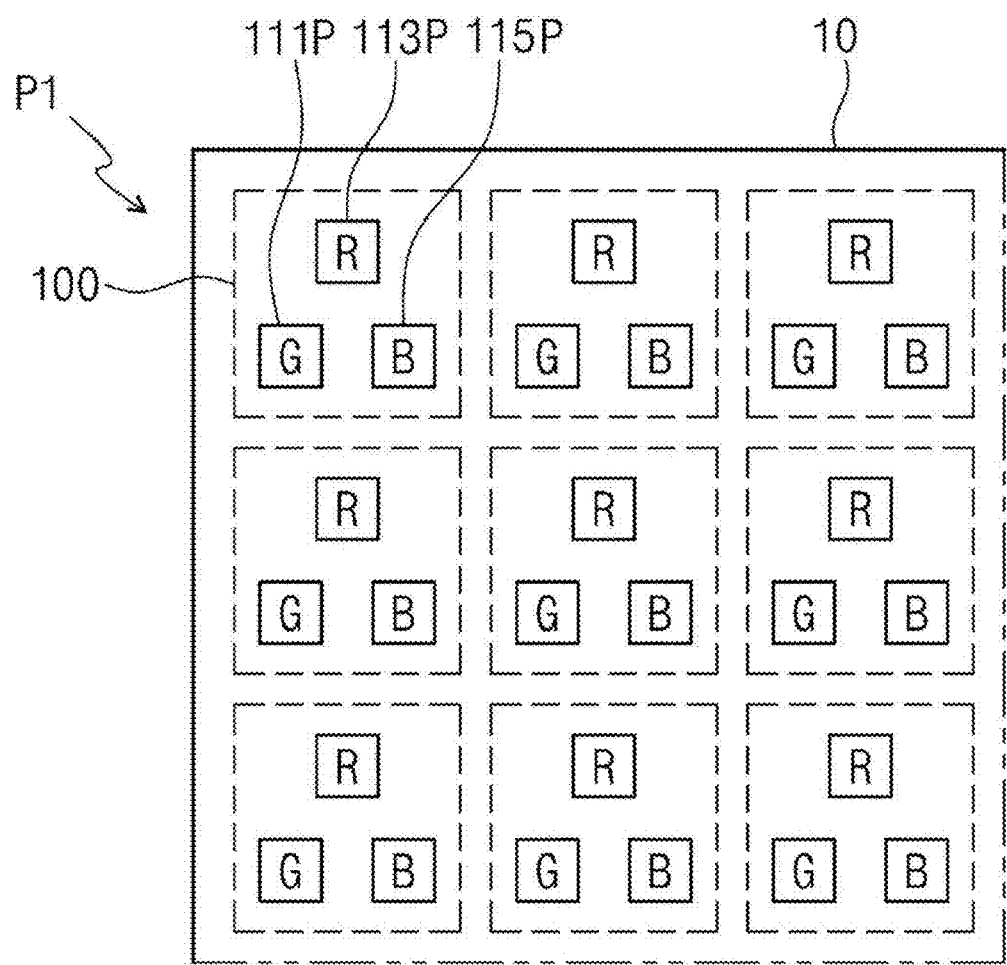
FIG. 2 is an enlarged plan view of portion P1 of FIG. 1.

FIG. 1 is a plan view of a display apparatus according to an exemplary embodiment, and FIG. 2 is an enlarged plan view of portion P1 of FIG. 1.

Referring to FIGS. 1 and 2, a display apparatus 10 according to an exemplary embodiment displays any visual information, for example, text, video, photographs, two-dimensional or three-dimensional image, or the like.

The display apparatus 10 may be provided in various shapes, for example, a closed polygon including straight lines, such as a rectangle, a circle, or an ellipse each including a curved line, and a semicircle and a semi-ellipse including straight and curved lines. Hereinafter, the display apparatus will exemplarily be illustrated as having substantially a rectangular shape.

The display apparatus 10 includes a plurality of pixels 100 for displaying an image. Each of the pixels 100 may be a minimum unit for displaying the image. Each pixel 100 may emit white light and/or color light. Each pixel 100 may include one sub-pixel emitting one color, but may include a plurality of different sub-pixels, and thus, different colors may be combined to generate white light and/or color light.

Each pixel 100 may be implemented as a light emitting device. As such, hereinafter, the term "light emitting device" may refer to a pixel, considering that the light emitting device may be used to implement one pixel.

In the illustrated exemplary embodiment, each pixel 100 may include a plurality of light emitting cells or sub-pixels implemented as a plurality of light emitting cells, and the other component for converting light emitted from the light emitting cells. The plurality of light emitting cells may be implemented by, for example, first to third light emitting cells 111P, 113P, and 115P.

According to an exemplary embodiment, each pixel may include a light emitting cell "G" for emitting green light, a light emitting cell "R" for emitting red light, and a light emitting cell "B" for emitting blue light, and the first to third light emitting cells 111P, 113P, and 115P may correspond the light emitting cell "G" emitting green light, the light emitting cell "R" emitting red light, and the light emitting cell "B" emitting blue light, respectively. However, the inventive concepts are not limited thereto. For example, each pixel 100 may include light emitting cells emitting cyan, magenta, yellow light, and the like, and each pixel 100 may include the light emitting cell "G" emitting green light, the light emitting cell "R" emitting red light, and the light emitting cell "B" emitting blue light.

The pixels 100 and/or the light emitting cells 111P, 113P, and 115P are arranged in a matrix form. As used herein, the phrase that the pixels 100 and/or the light emitting cells 111P, 113P, and 115P are arranged in the matrix form may encompass that the pixels 100 and/or the light emitting cells 111P, 113P, and 115P are arranged exactly in rows or columns, arranged in rows or columns as a whole, and arranged in a zigzag shape while detailed positions thereof may be changed.

Figure 3:
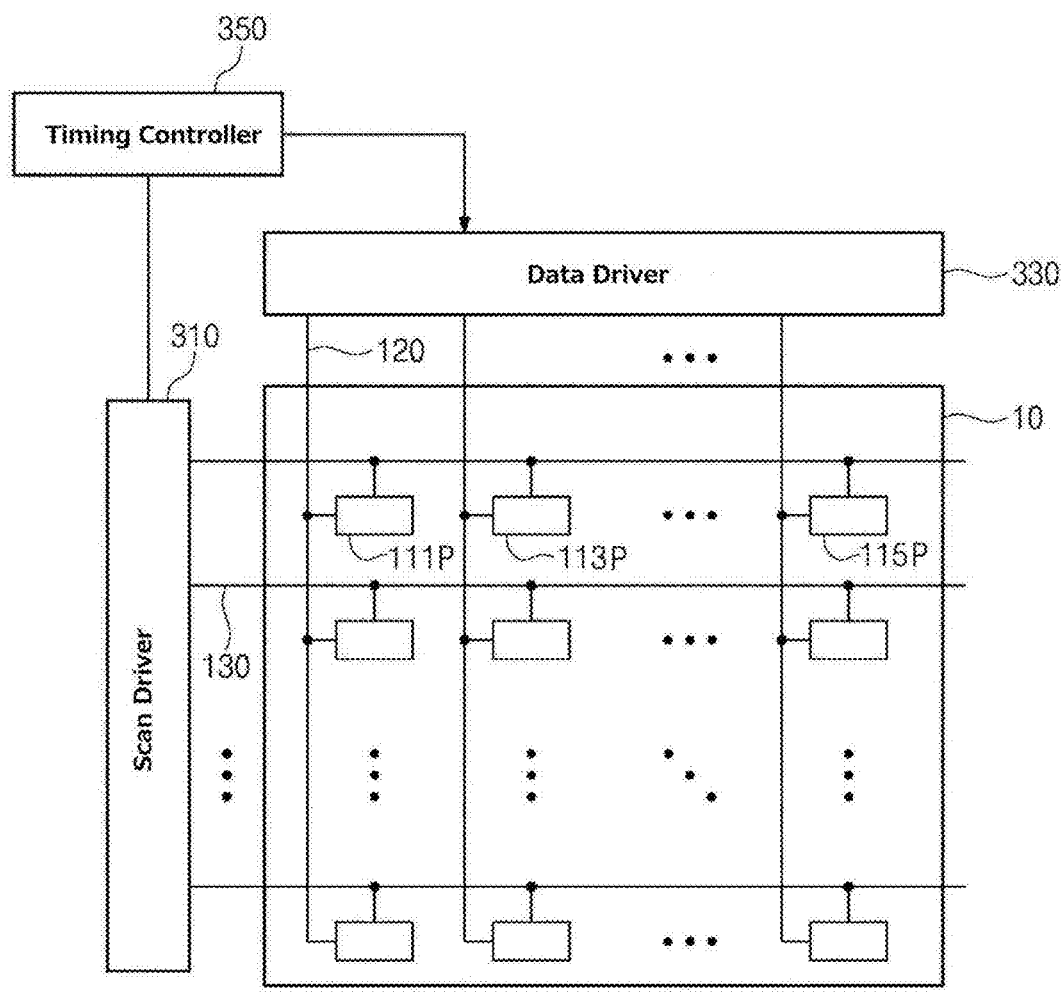
FIG. 3 is a structural diagram of a display apparatus according to an exemplary embodiment.

FIG. 3 is a structural diagram of a display apparatus according to an exemplary embodiment.

Referring to FIG. 3, the display apparatus 10 according to an exemplary embodiment includes a timing controller 350, a scan driver 310, a data driver 330, a wiring unit, and pixels. When the pixels include the light emitting cells 111P, 113P, and 115P, each of the light emitting cells 111P, 113P, and 115P is individually connected to the scan driver 310 and the data driver 330 through the wiring unit.

The timing controller 350 receives various control signals and image data required for driving the display apparatus from the outside, such as a system for transmitting image data. The timing controller 350 rearranges the received image data and transmits the image data to the data driver 330. In addition, the timing controller 350 generates scan control signals and data control signals required for driving the scan driver 310 and the data driver 330, and transmits the scan control signals and data control signals to the scan driver 310 and the data driver 330, respectively.

The scan driver 310 receives a scan control signal from the timing controller 350 and generates a scan signal corresponding thereto.

The data driver 330 receives a data control signal and image data from the timing controller 350 and generates a data signal corresponding thereto.

The wiring unit includes a plurality of signal wires. More particularly, the wiring unit may include first wires 130 connecting the scan driver 310 to the light emitting cells 111P, 113P, and 115P, and second wires 120 connecting the data driver 330 to the light emitting cells 111P, 113P, and 115P. In the illustrated exemplary embodiment, the first wires 130 may be scan lines and the second wires 120 may be data lines. Hereinafter, the first wires will be referred to as the scan lines, and the second wires will be referred to as the data lines. In addition, the wiring unit may further include wires connecting the timing controller 350 to the scan driver 310, the timing controller 350 to the data driver 330, to transmit signals.

The scan lines 130 provide the scan signals generated from the scan driver 310 to the light emitting cells 111P, 113P, and 115P. The data signal generated from the data driver 330 is output to the data lines 120. The data signal output to the data lines 120 is input to the light emitting cells 111P, 113P, and 115P of a horizontal pixel line selected by the scan signal.

The light emitting cells 111P, 113P, and 115P are connected to the scan lines 130 and the data lines 120. The light emitting cells 111P, 113P, and 115P selectively emit light in response to the data signal input from the data lines 120 when the scan signal is supplied from the scan lines 130. For example, during each frame period, each of the light emitting cells 111P, 113P, and 115P emits light with a luminance corresponding to the input data signal. The light emitting cells 111P, 113P, and 115P that receive the data signal corresponding to black luminance may not emit light during a corresponding frame period to display black.

In an exemplary embodiment, the sub-pixels (or the light emitting cells) may be driven in a passive manner or in an active manner. When the display apparatus is driven in the active manner, the display apparatus may be driven by further receiving first and second sub-pixel power in addition to the scan signal and the data signal.

Figure 4A:
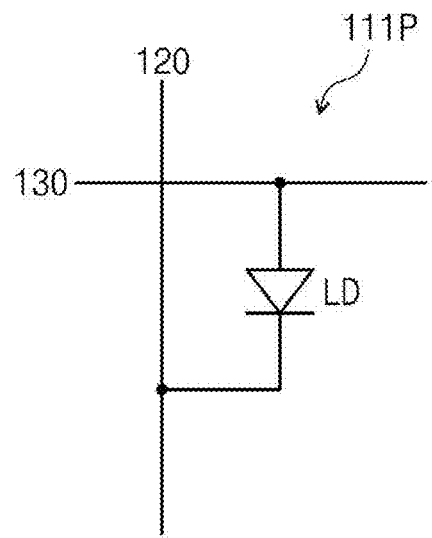
FIG. 4A is a circuit diagram of a pixel in a passive display apparatus.

FIG. 4A is a circuit diagram of a sub-pixel constituting a passive display apparatus. The illustrated sub-pixel may be any one of the red sub-pixel, the green sub-pixel, and the blue sub-pixel, and the sub-pixel of FIG. 4A will exemplarily be described with reference to the first light emitting cell 111P.

Referring to FIG. 4A, the first light emitting cell 111P includes a light source LD connected between the scan line 130 and the data line 120. The light source LD may be a light emitting diode having first and second terminals. The first and second terminals are connected to a first electrode (e.g., an anode) and a second electrode (e.g., a cathode) in the light emitting cell, respectively. The first terminal may be connected to the scan line 130, the second terminal may be connected to the data line 120, or vice versa.

The light source LD emits light with luminance corresponding to a magnitude of the applied voltage when a voltage equal to or greater than a threshold voltage is applied between the first electrode and the second electrode. More particularly, the voltage of the scan signal applied to the scan line 130 and/or the data signal applied to the data line 120 may be adjusted to control the light emission of the first light emitting cell 111P.

In the illustrated exemplary embodiment, only one light source LD is shown as being connected between the scan line 130 and the data line 120, but the inventive concepts are not limited thereto. For example, in some exemplary embodiments, a plurality of light sources LD may be connected between the scan line 130 and the data line 120, and in this case, the light sources LD may be connected in parallel or in series.

Figure 4B:
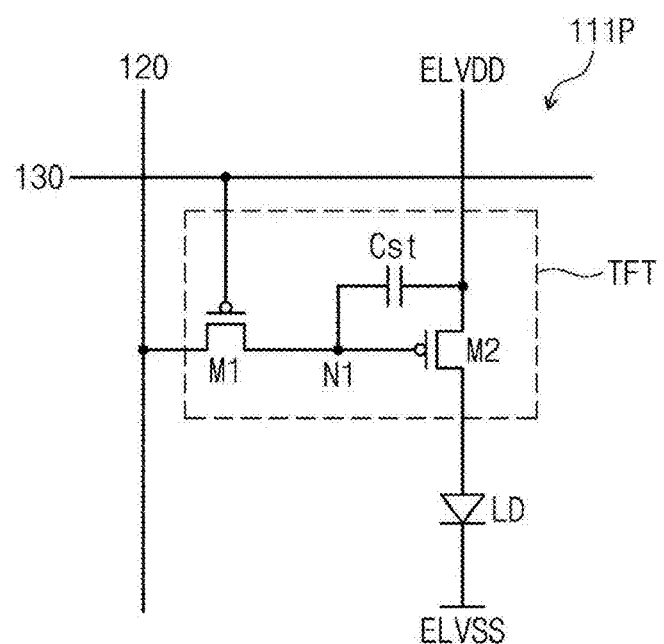
FIG. 4B is a circuit diagram of a pixel in an active display apparatus.

FIG. 4B is a circuit diagram of a sub-pixel constituting the active display apparatus. When the display apparatus is formed in the active manner, the first light emitting cell 111P may be driven by further receiving first and second sub-pixel power sources ELVDD and ELVSS in addition to the scan signal and the data signal.

Referring to FIG. 4B, the first light emitting cell 111P includes one or more light sources LD and a transistor unit TFT connected thereto.

The first electrode of the light source LD is connected to the first sub-pixel power source ELVDD via the transistor unit TFT, and the second electrode is connected to the second sub-pixel power source ELVSS. The first sub-pixel power source ELVDD and the second sub-pixel power source ELVSS may have different potentials. For example, the second sub-pixel power source ELVSS may have a potential lower than a potential of the first sub-pixel power source ELVDD by the threshold voltage of the light emitting cell or more. Each light source emits light with the luminance corresponding to a driving current controlled by the transistor unit TFT.

According to an exemplary embodiment, the transistor unit TFT includes first and second transistors M1 and M2 and a storage capacitor Cst. However, the structure of the transistor unit TFT is not limited to that shown in FIG. 4B.

A source electrode of the first transistor M1 (e.g., a switching transistor) is connected to the data line 120 and a drain electrode thereof is connected to a first node N1. Furthermore, a gate electrode of the first transistor M1 is connected to the scan line 130. The first transistor M1 is turned on when a scan signal of a voltage, at which the first transistor M1 is turned on, is supplied from the scan line 130, thereby electrically connecting the data line 120 to the first node N1. At this time, the data signal of the corresponding frame is supplied to the data line 120, and thus, the data signal is transmitted to the first node N1. The data signal transmitted to the first node N1 is charged in the storage capacitor Cst.

A source electrode of the second transistor M2 (e.g., a driving transistor) is connected to the first sub-pixel power source ELVDD, and a drain electrode thereof is connected to the first electrode of the light emitting cell. Furthermore, a gate electrode of the second transistor M2 is connected to the first node N1. The second transistor M2 controls the amount of driving current supplied to the light emitting cell in response to the voltage of the first node N1.

One electrode of the storage capacitor Cst is connected to the first sub-pixel power source ELVDD and the other electrode is connected to the first node N1. The storage capacitor Cst charges a voltage corresponding to the data signal supplied to the first node N1 and maintains the charged voltage until the data signal of the next frame is supplied.

FIG. 4B exemplarily illustrates a transistor unit TFT including two transistors. However, the inventive concepts are not limited thereto and the structure of the transistor unit TFT may be variously modified. For example, in some exemplary embodiments, the transistor unit may include more transistors or capacitors. In addition, detailed structures of the first and second transistors, the storage capacitors, and the lines are not particularly limited.

Figure 5A:
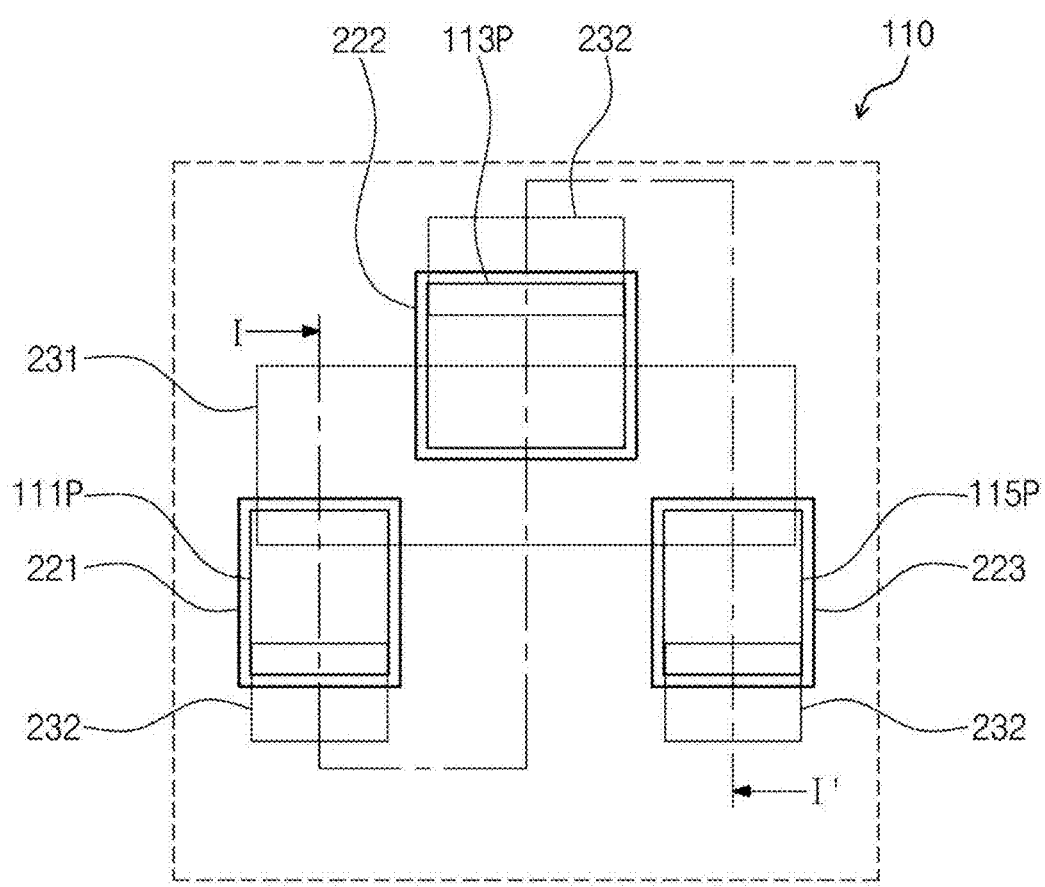
FIG. 5A is a plan view illustrating one pixel in a display apparatus of FIG. 2.
Figure 5B:
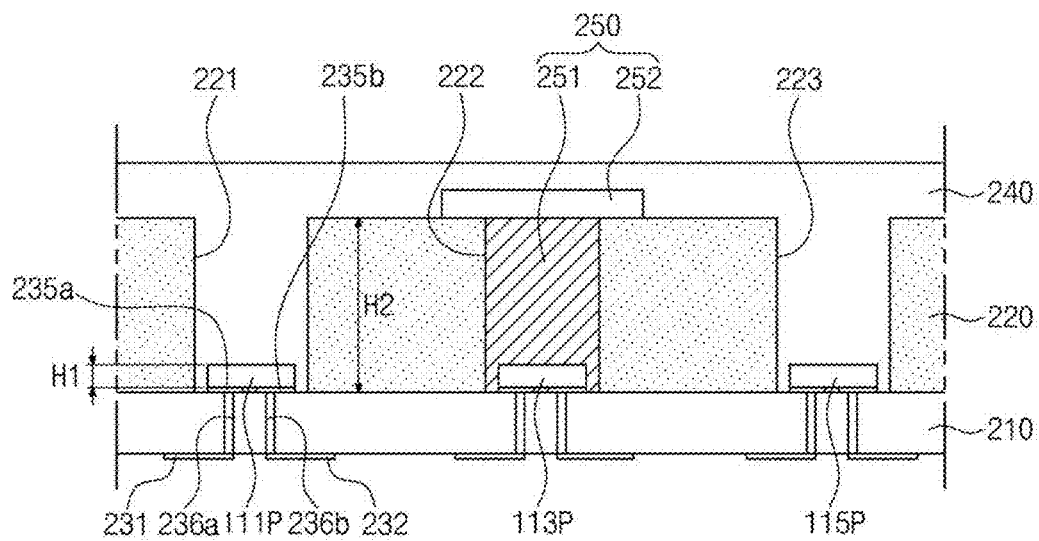
FIG. 5B is a cross-sectional view taken along line I-I' of FIG. 5A.

FIG. 5A is a plan view of one pixel of a display apparatus illustrated in FIG. 2 and FIG. 5B is a cross-sectional view taken along line I-I' of FIG. 5A.

According to an exemplary embodiment, the first light emitting cell 111P, the second light emitting cell 113P, and the third light emitting cell 115P, which are provided on a substrate 210 and are capable of emitting red light, green light, and blue light, respectively, are provided.

A partition wall 220 preventing light from being transmitted is provided between each of the first to third light emitting cells 111P, 113P, and 115P. A height of each of the first to third light emitting cells 111P, 113P, and 115P is less than a height of the partition wall 220.

In addition, a distance between the partition wall 220 and each of the first light emitting cell to the third light emitting cell 111P, 113P, and 115P is about 10 μm to about 20 μm or less.

Hereinafter, the first to third light emitting cells 111P, 113P, and 115P may be collectively referred to as "light emitting cells" in describing features that can be commonly applied to each of the light emitting cells.

In addition, a set of the first to third light emitting cells 111P, 113P, and 115P, which may be a minimum unit capable of emitting white light, may be referred to as a 'pixel' or 'light emitting device'.

Hereinafter, each component included in the display apparatus will be described in more detail.

The substrate 210 may include the wiring unit for providing power and a signal to the pixel 100.

The wiring unit including the scan lines and data lines, which are connected to the pixel 100, and/or the transistor unit may be formed on the substrate 210.

In an exemplary embodiment, the substrate 210 may be a printed circuit board. When the substrate 210 is provided as the printed circuit board, the wiring unit connected to the pixel 100 may be provided on the printed circuit board, and in addition, circuits such as the timing controller, the scan driver, and the data driver may be mounted thereon.

The printed circuit board may be a double-sided printed circuit board, on which opposite sides of the wiring unit are formed thereon. In this case, wiring unit may include pad portions 235a and 235b provided on an upper surface of the printed circuit board to be electrically connected to the pixel 100, and connection portions penetrating the upper and lower surfaces of the printed circuit board. Electrodes 231 and 232 or wires may be mounted on the lower surface of the printed circuit board, and the wires of the pixel 100 may be connected to the electrodes 231 and 232 or the wires of the lower surface of the printed circuit board through the pad portions 235a and 235b and the connecting portions.

However, the substrate 210 in some exemplary embodiments may be provided differently as the pixel 100 is capable of being mounted in addition to the printed circuit board. For example, the substrate 210 may be an insulating substrate, such as glass, quartz, plastic, or the like, on which the wiring unit formed. In this case, circuits such as the timing controller, the scan driver, the data driver, and the like may be directly formed on the insulating substrate, or may be provided to a separate printed circuit board and then connected to the wiring unit of the insulating substrate.

The substrate 210 may be made of a hard material, but is not limited thereto, and in some exemplary embodiments, may be made of a flexible material. When the display apparatus according to an exemplary embodiment is implemented as a bent or bendable display apparatus, it may be advantageous that the substrate 210 is made of the flexible material. In an exemplary embodiment, when the substrate 210 is made of a material, such as glass, quartz, or the like, the substrate 210 has a relatively higher heat resistance than an organic polymer substrate, and thus, there is an advantage that various laminations are possible on an upper surface thereof. When the substrate 210 is made of a transparent material, such as glass, quartz or the like, it may be advantageous to manufacture a front or bottom light emitting display apparatus. When the substrate 210 is made of an organic polymer, an organic-inorganic composite, or the like, the substrate 210 may have relatively high flexibility and it may be advantageous to manufacture a curved display apparatus.

At least one pixel 100 is mounted on the substrate 210 with a conductive adhesive layer interposed therebetween. In the display apparatus, the pixel 100 is mounted in a sub-pixel area of the substrate 210.

According to an exemplary embodiment, the pixel 100 includes the first light emitting cell 111P, the second light emitting cell 113P, and the third light emitting cell 115P. Each of the light emitting cells 111P, 113P, and 115P is provided on the substrate 210 to be spaced apart from one another on a plane.

The first to third light emitting cells 111P, 113P, and 115P may emit light having different wavelength bands. More particularly, when light emitted from each of the first to third light emitting cells 111P, 113P, and 115P is referred to as first to third lights, respectively, the first to third lights may have different wavelength bands. In the illustrated exemplary embodiment, as described above, the first to third lights may have wavelength bands of green, red, and blue, respectively, and in this case, the first to third light emitting cells 111P, 113P, and 115P may be implemented as green, red, and blue light emitting diodes, respectively.

However, the inventive concepts are not limited thereto, and according to another exemplary embodiment, some or all of the first to third light emitting cells 111P, 113P, and 115P may emit light having the same wavelength. For example, the first light emitting cell 111P may emit light having a first wavelength, and each of the second light emitting cell 113P and the third light emitting cell 115P may emit light having a second wavelength, which may be the same as or different from the first wavelength. In this case, a wavelength converter 250 may be provided on the second light emitting cell 113P or the third light emitting cell 115P. The wavelength converter 250 may convert a wavelength of light emitted from the light emitting cell. For example, light of ultraviolet or blue wavelength band emitted from the second light emitting cell 113P may be converted into light of the red wavelength band while passing through the wavelength converter 250. Accordingly, even when light having the same wavelength is emitted from some or all of the first to third light emitting cells 111P, 113P, and 115P, a user may visually recognize light having different wavelengths from the light emitting cells 111P, 113P, and 115P.

Each of the light emitting cells 111P, 113P, and 115P is mounted on the pad portions 235a and 235b provided on the upper surface of the substrate 210. In this case, a conductive adhesive layer may be provided between the light emitting cells 111P, 113P, and 115P and the pad portions 235a and 235b to ensure stable electrical connection. The conductive adhesive layer may be made of conductive paste or conductive resin, such as solder paste, silver paste, or the like.

The pad portions 235a and 235b may be connected to the electrodes 231 and 232 provided on the bottom surface of the substrate 210 by the connection portions 236a and 236b passing through the substrate 210. In this case, the electrodes 231 and 232 may include the common electrode 231 and the sub-pixel electrode 232. The first to third light emitting cells 111P, 113P, and 115P provided in the pixel 100 may be connected to one common electrode 231. In addition, a plurality of sub-pixel electrodes 232 may be provided, and each of the sub-pixel electrodes 232 may correspond to the first to third light emitting cells 111P, 113P, and 115P, respectively.

According to an exemplary embodiment, the light emitting cells 111P, 113P, and 115P provided in one pixel 100 may be connected to the same common electrode 231 to simplify a wiring structure and to improve manufacturing process efficiency of the display apparatus. When the plurality of light emitting cells 111P, 113P, and 115P are connected one common electrode 231, the size of the common electrode 231 may be relatively greater than the size of each sub-pixel electrode 232.

The common electrode 231 and the sub-pixel electrode 232 may be connected to the data line and the scan line of the display apparatus. Accordingly, the scan signal and the data signal may be transmitted to the light emitting cells 111P, 113P, and 115P through the common electrode 231 and the sub-pixel electrode 232.

The common electrode 231 and the sub-pixel electrode 232 may be electrodes of different types. For example, when the common electrode 231 may be a p-type electrode, each sub-pixel electrode 232 may be an n-type electrode, and vice versa.

The size of the common electrode 231 and the size of the sub-pixel electrode 232 may be greater than the size of a first terminal and the size of a second terminal of the light emitting cell.

The partition wall 220 is provided on the substrate 210. In this case, the partition wall 220 is provided between the first to third light emitting cells 111P, 113P, and 115P.

The partition walls 220 may be integrally connected to one another, or may be separated from one another. For example, the partition wall 220 provided between the first light emitting cell 111P and the second light emitting cell 113P, and the partition wall provided between the second light emitting cell 113P and the third light emitting cell 115P may be connected to each other, or may be separated from each other.

Hereinafter, the partition walls 220 provided between the respective light emitting cells 111P, 113P, and 115P will exemplarily be described as being connected to each other and integrally provided.

The partition wall 220 according to an exemplary embodiment integrally includes a plurality of openings 221, 222, and 223 for each pixel 100. The light emitting cells 111P, 113P, and 115P may be formed in the openings 221, 222, and 223 defined in the partition wall 220.

The partition wall 220 may be an insulating film made of a non-conductive material, and may not transmit light. In an exemplary embodiment, the partition wall 220 may be made of a light absorbing material. The partition wall 220 may be provided in black, and for example, may be formed of a light blocking material used for the display apparatus.

According to an exemplary embodiment, the partition wall 220 may be formed of a composition, in which a photo solder resist (PSR) and a light absorbing material are mixed. When the partition wall 220 is formed of the composition mixed with the photo solder resist and the light absorbing material, a process of forming the partition wall 220 may be simplified. More particularly, the composition is applied at room temperature and photocured, and thus, it is possible to form the partition wall 220 without a harsh process condition.

Various materials may be used as the photo solder resist (PSR) for forming the partition wall 220. For example, the photo solder resist may include a photosensitive organic polymer. The photosensitive organic polymer may be any one selected from polyethylene, polypropylene, polyvinyl chloride, polystyrene, acrylonitrile-butadiene-styrene resin (ABS resin), methacrylate resin, polyamide, polycarbonate, polyacetyl, polyethylene terephthalate, modified polyphenylene oxide (PPO) resin, polybutylen terephthalate, polyurethane, phenolic resin, phenolic resin, urea resin, melamine resin, or a combination thereof.

In addition, to help a photocuring reaction of the photo solder resist (PSR), the composition for forming the partition wall 220 may further include a photosensitive curing agent. However, the inventive concepts are not limited thereto, and in other exemplary embodiments, the partition wall 220 may be formed using various materials in addition to the above materials.

In addition, in an exemplary embodiment, the composition for forming the partition wall 220 may be a mixture of polydimethylsiloxane (PDMS) and carbon particles.

The partition wall 220 may include a light absorbing material and may absorb some of light emitted from the light emitting cells 111P, 113P, and 115P. More particularly, a fraction of light emitted from the light emitting cells 111P, 113P, and 115P and traveling toward the adjacent light emitting cell 111P, 113P, or 115P may be absorbed by the partition wall 220. Accordingly, it is possible to prevent undesired mixing of light emitted from different light emitting cells 111P, 113P, and 115P. In addition, because undesired color mixing of the light is prevented, the color combinations of light, which is visibly recognized, are the same even when the display apparatus is viewed from any direction.

However, prevention of undesired color mixing of light by the partition wall 220 does not mean completely blocking the color mixing of various light emitted from one pixel 100. For example, when one pixel 100 includes the plurality of light emitting cells 111P, 113P, and 115P, and when the red light, blue light, and green light are emitted from each light emitting cell, the red light, blue light, and green light may be mixed to be recognized as white light by the user. The partition wall 220 prevents the white light from being visibly recognized in a different color when the display apparatus is viewed in a direction not perpendicular to the display apparatus, which may otherwise cause undesired mixing of light emitted from adjacent pixels.

To prevent the undesired mixing, a height of the partition wall 220 is greater than a height of each of the light emitting cells 111P, 113P, and 115P. For example, when the partition wall 220 has a second height H2 and any one of the first to third light emitting cells 111P, 113P, and 115P has a first height H1, the second height H2 is greater than the first height H1.

In this case, the first height H1 is a distance from the upper surface of the substrate 210 to the upper surface of one of the light emitting cells 111P, 113P, and 115P. When unevenness is provided on the upper surface of one of the light emitting cells 111P, 113P, and 115P, and the upper surface of one light emitting cell is curved, the first height H1 may be a distance from the upper surface of the substrate 210 to an uneven end of the upper surface of one of the light emitting cells 111P, 113P, and 115P.

The second height H2 is a distance from a surface where the substrate 210 is in contact with the partition wall 220 to the upper surface of the partition wall 220. In addition, when a thickness of the partition wall 220 is different depending on a planar position, the second height H2 may be an average of the distance from the surface where the substrate 210 is in contact with the partition wall 220 to the upper surface of the partition wall 220.

The second height H2 may be about 15 μm to about 115 μm. In this range, the partition wall 220 may prevent undesired mixture of light emitted from the first to third light emitting cells 111P, 113P, and 115P. When the second height H2 exceeds about 115 μm, the amount of light emitted from the light emitting cells 111P, 113P, and 115P may be excessively reduced or the thickness of the entire display apparatus may become excessively large. When the second height H2 is less than about 15 μm, undesired color mixing may occur between light emitted from the light emitting cells 111P, 113P, and 115P. When the light emitting cells 111P, 113P, and 115P, which are different from one another, are provided in the pixel 100, the first height H1 may vary for each of the light emitting cells 111P, 113P, and 115P. In this case, the second height H2 may be greater than the first height H1 of any of the light emitting cells 111P, 113P, and 115P.

According to an exemplary embodiment, the difference between the second height H2 and the first height H1 may be greater than 0 and less than or equal to about 100 μm. When the difference between the second height H2 and the first height H1 is greater than about 100 μm, mixing of light emitted from one pixel 100 may be blocked, and thus, it may be difficult to implement the white light.

When the pixel 100 has a flip chip structure, the first height H1 may be about 10 μm to about 20 μm. Accordingly, the thickness of the partition wall 220 or the second height H2 may become relatively small and the thickness of the entire display apparatus may be reduced.

Widths of the openings 221, 222, and 223 provided with the light emitting cells 111P, 113P, and 115P may vary depending on the light emitting cells 111P, 113P, and 115P. For example, sizes of the openings 221, 222, and 223 may also vary depending on sizes of the light emitting cells 111P, 113P, and 115P.

The widths of the openings 221, 222, and 223 are greater than the widths of the light emitting cells 111P, 113P, and 115P. The light emitting cells 111P, 113P, and 115P may not contact with the sidewall of the partition wall 220 forming the openings 221, 222, and 223.

The distance between the light emitting cells 111P, 113P, and 115P and the sidewalls of the openings 221, 222, and 223 may be about 10 μm to about 20 μm. In this range, a ratio of an area opened by the openings 221, 222, and 223 may be reduced, while the partition wall 220 may prevent undesired mixing of light emitted from the light emitting cells 111P, 113P, and 115P. In an exemplary embodiment, an area occupied by the partition wall 220 in a planar area of the display apparatus may be about 50% to about 99% of a total area. As the area occupied by the partition wall 220 becomes relatively large, a contrast ratio of the display apparatus may be improved.

According to an exemplary embodiment, a width of each of the light emitting cells 111P, 113P, 115P may be about 200 μm or less. For example, when each of the light emitting cells 111P, 113P, and 115P has a rectangular shape, the length of one side of the rectangle may be about 200 μm or less. In this manner, more light emitting cells 111P, 113P, and 115P may be mounted in the same area. Accordingly, resolution of the display apparatus may be improved.

According to an exemplary embodiment, the wavelength converter 250 may be further provided on the light emitting cells 111P, 113P, and 115P. In an exemplary embodiment, the wavelength converter 250 may be provided only on some of the light emitting cells 111P, 113P, and 115P. For example, the wavelength converter 250 may be provided only on the second light emitting cell 113P. The wavelength converter 250 provided on the second light emitting cell 113P converts the wavelength band of light emitted from the second light emitting cell 113P. Light passing through the wavelength converter 250 may be viewed in a different color than from light emitted from the second light emitting cell 113P. In addition, the wavelength of light after passing through the wavelength converter 250 may be different from the wavelength of light emitted from the first light emitting cell 111P or the third light emitting cell 115P, to which the wavelength converter 250 is not provided. The wavelength converter 250 may absorb light having a relatively short wavelength, and then emit light having a wavelength longer than the wavelength of the absorbed light.

For example, when blue light is emitted from the first light emitting cell 111P, and green light is emitted from the third light emitting cell 115P, light emitted from the second light emitting cell 113P and passed through the wavelength converter 250 may be recognized as red light. In this case, light emitted from the second light emitting cell 113P may be the blue light, the green light, an ultraviolet light, or the like. The blue light, green light, or ultraviolet light is converted into the red light by the wavelength converter 250.

The wavelength converter 250 may include a phosphor layer 251 and a color filter 252. Both the phosphor layer 251 and the color filter 252 perform a function of converting the wavelength of the received light into a specific wavelength band. In an exemplary embodiment, the phosphor layer 251 and the color filter 252 may respectively convert light to have a difference wavelength band width. For example, the color filter 252 may include a quantum dot material and may convert the received light into light having a relatively narrow bandwidth, while the phosphor layer 251 may convert the received light into light having a relatively wide bandwidth.

A red color filter may be further provided on the wavelength converter 250. The color filter 252 may be omitted and when the red color filter is provided, and the red color filter may further implement higher purity colors.

The phosphor layer 251 may substantially fill the opening 222. Accordingly, light emitted from the light emitting cell 113P may pass through the phosphor layer 251 before being visible to the eyes of a user.

The phosphor layer 251 may be provided in a form, in which polydimethylsiloxane (PDMS), polyimide (PI), and poly (methyl 2-methylpropenoate) (PMMA) are mixed with a transparent or translucent binder, such as ceramic.

The color filter 252 may be spaced apart from the light emitting cell 113P. A width of the color filter 252 may be greater than the width of the opening 222. Accordingly, a portion of the color filter layer 252 may overlap the partition wall 220 in plan view. In this manner, light emitted from the light emitting cell 113P may be prevented from being visibly recognized by the user without passing through the color filter 252 in addition to improving structural stability thereof.

The color filter 252 may enhance the color purity of light. In particular, the color filter 252 may block the blue light or ultraviolet light, which is not completely converted by the phosphor layer 251. In addition, light from adjacent first and third light emitting cells 111P and 115P are blocked to prevent the color mixing of light emitted from the second light emitting cell 113P. As such, the phosphor layer 251 and the color filter 252 according to an exemplary embodiment are provided in the wavelength converter 250 to further improve the color purity.

According to an exemplary embodiment, a protective layer 240 may be provided on the light emitting cells 111P and 115P and the partition wall 220. The protective layer 240 may substantially fill insides of the openings 221 and 223, in which the wavelength converter 250 is not provided. The protective layer 240 may cover the surface of the partition wall 220.

The protective layer 240 is optically transparent. Accordingly, light emitted from the light emitting cells 111P and 115P or passed through the wavelength converter 250 may maintain its optical characteristics even after passing through the protective layer 240. The protective layer 240 may be formed of an optically transparent material. The protective layer 240 may be formed of epoxy, polysiloxane, photoresist, or the like. For example, the polysiloxane material may be polydimethylsiloxane (PDMS). However, the material of the protective layer 240 is not limited thereto, and a material such as hydrogen silsesquioxane (HSSQ), methyksilsesquioxane (MSSQ), polyimide, divinyl siloxane, bis-benzocyclobutane (DVS-BCS), perfluorocyclobutane (PFCB), and polyarylene ether (PAE) may be used as the material of the protective layer 240.

A thickness of the protective layer 240 may be determined in consideration of the total thickness of the display apparatus. For example, the protective layer 240 may be provided, such that the distance from the bottom surface of the substrate 210 to the upper surface of the protective layer 240 is about 1 mm or less. In this range, it is possible to protect the light emitting cells 111P and 115P under the protective layer 240 and to reduce the overall thickness of the display apparatus.

Figure 6:
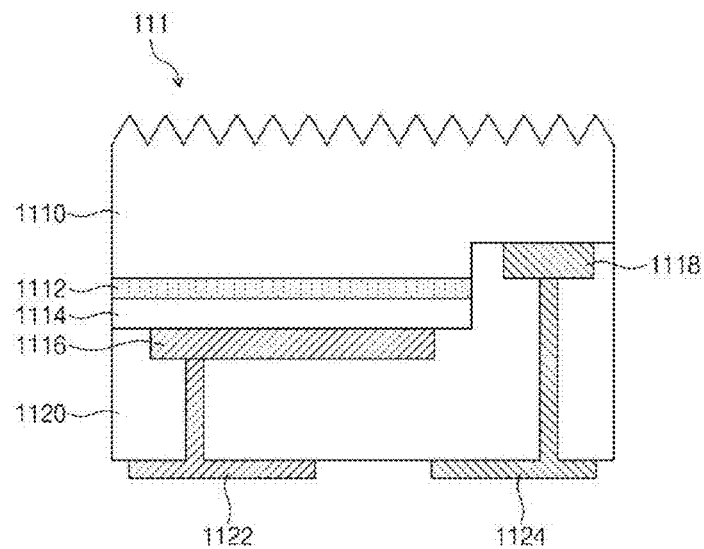
FIG. 6 is a cross-sectional view illustrating a light emitting cell according to an exemplary embodiment.

FIG. 6 is a cross-sectional view of a light emitting cell according to an exemplary embodiment. According to the illustrated exemplary embodiment, the first to third light emitting cells 111P, 113P, and 115P may employ a light emitting diode of a flip chip type, as shown in FIG. 6. Hereinafter, among the first to third light emitting cells 111P, 113P, and 115P, the first light emitting cell 111P will exemplarily be described as a light emitting cell 111 shown in FIG. 6.

Referring to FIG. 6, the light emitting cell 111 includes a first conductivity type semiconductor layer 1110, an active layer 1112, a second conductivity type semiconductor layer 1114, a first contact layer 1116, a second contact layer 1118, an insulating layer 1120, a first terminal 1122, and a second terminal 1124.

The first conductivity type semiconductor layer 1110, the active layer 1112, and the second conductivity type semiconductor layer 1114 may be collectively referred to as a semiconductor layer. The type of semiconductor layer may vary depending on the wavelength of light emitted from the light emitting cells. In an exemplary embodiment, when the light emitting cell emits green light, the semiconductor layer includes indium gallium nitride (InGaN), gallium nitride (GaN), gallium phosphide (GaP), aluminum gallium indium phosphide (AlGaInP), and aluminum gallium phosphide (AlGaP). When the light emitting cell emits red light, the semiconductor layer may include aluminum gallium arsenide (AlGaAs), gallium arsenide phosphide (GaAsP), aluminum gallium indium phosphide (AlGaInP), and gallium phosphide (GaP), for example. When the light emitting cell emits blue light, the semiconductor layer may include gallium nitride (GaN), indium gallium nitride (InGaN), and zinc selenide (ZnSe), for example.

The first conductivity type semiconductor layer 1110 and the second conductivity type semiconductor layer 1114 have opposite polarities. For example, when the first conductivity type is n-type, the second conductivity type is p-type, and when the first conductivity type is p-type, the second conductivity type is n-type. In an exemplary embodiment, the first semiconductor layer 1110 may be the n-type semiconductor layer 1110 and the second semiconductor layer 1114 may be the p-type semiconductor layer 1114. Hereinafter, the n-type semiconductor layer 1110, the active layer 1112, and the p-type semiconductor layer 1114 will exemplarily be described as being sequentially formed.

The n-type semiconductor layer 1110, the active layer 1112, and the p-type semiconductor layer 1114 may be formed of a III-V series nitride-based semiconductor, for example, nitride-based semiconductor such as (Al, Ga, In)N. The n-type semiconductor layer 1110, the active layer 1112, and the p-type semiconductor layer 1114 may be formed using metal organic chemical vapor deposition (MOCVD) or the like. In addition, the n-type semiconductor layer 1110 includes n-type impurities (e.g., Si, Ge, Sn), and the p-type semiconductor layer 1114 includes p-type impurities (e.g., Mg, Sr, Ba). In an exemplary embodiment, the n-type semiconductor layer 1110 may include GaN or AlGaN including Si as a dopant, and the p-type semiconductor layer 1114 may include GaN or AlGaN including Mg as a dopant.

Although the n-type semiconductor layer 1110 and the p-type semiconductor layer 1114 are each illustrated as a single layer, in some exemplary embodiments, each of the n-type semiconductor layer 1110 and the p-type semiconductor layer 1114 may be multiple layers or a superlattice layer. The active layer 1112 may include a single quantum well structure or a multi-quantum well structure, and the composition ratio thereof may be adjusted to emit light having a desired wavelength. For example, the active layer 1112 may emit blue light or ultraviolet light.

The second contact layer 1118 is disposed on the first conductivity type semiconductor layer 1110, where the active layer 1112 and the second conductivity type semiconductor layer 1114 are not provided. The first contact layer 1116 is disposed on the second conductivity type semiconductor layer 1114.

Each of the first and/or second contact layers 1116 and 1118 may be made of a single-layer metal or multi-layer metal. Metals such as Al, Ti, Cr, Ni, Au, and alloys thereof may be used as the material of the first and/or second contact layers 1116 and 1118.

The insulating layer 1120 is provided on the first and second contact layers 1116 and 1118. The first terminal 1122 connected to the first contact layer 1116 through a contact hole and the second terminal 1124 connected to the second contact layer 1118 through a contact hole are provided on the insulating layer 1120.

The first terminal 1122 may be connected to one of a first connection electrode and a second connection electrode through a second conductive adhesive layer, and the second terminal 1124 may be connected to the other one of the first connection electrode and the second connection electrode through the second conductive adhesive layer.

The first and/or second terminals 1122 and/or 1124 may be made of a single-layer metal or multi-layer metal. Metals such as Al, Ti, Cr, Ni, Au, and alloys thereof may be used as the material of the first and/or second terminals 1122 and/or 1124.

In an exemplary embodiment, the light emitting cell may further include a layer having additional functions in addition to the above-described layers. For example, various layers may be further included, such as a reflective layer for reflecting light, an additional insulating layer for insulating a specific component, a solder preventing layer for preventing diffusion of solder, and the like.

In an exemplary embodiment, the surface of the first conductivity type semiconductor layer 1110 or the n-type semiconductor layer 1110 may include irregularities. More particularly, the irregularities may be formed on a surface from which light is emitted in the light emitting cell 111. The irregularities may be provided to improve the light extraction efficiency. The irregularities may be randomly provided in various forms, such as a polygonal pyramid and a hemisphere, and may be provided in various forms, such as a surface having roughness.

In addition, in forming the flip chip type light emitting cell 111, mesas may be formed in various forms, and, positions or shapes of the first and second contact layers 1116 and 1118 or the first and second terminals 1122 and 1124 may be variously changed as needed.

According to an exemplary embodiment, the light emitting cell 111 may be a vertical or perpendicular light emitting cell. Even when the light emitting cell 111 is a vertical light emitting cell, the first conductivity type semiconductor layer 1110, the active layer 1112, and the second conductivity type semiconductor layer 1114 may be sequentially stacked. In this case, features of the first conductivity type semiconductor layer 1110, the active layer 1112, and the second conductivity type semiconductor layer 1114 are the same as those described above with respect to the flip chip type light emitting cell 111.

Figure 7A:
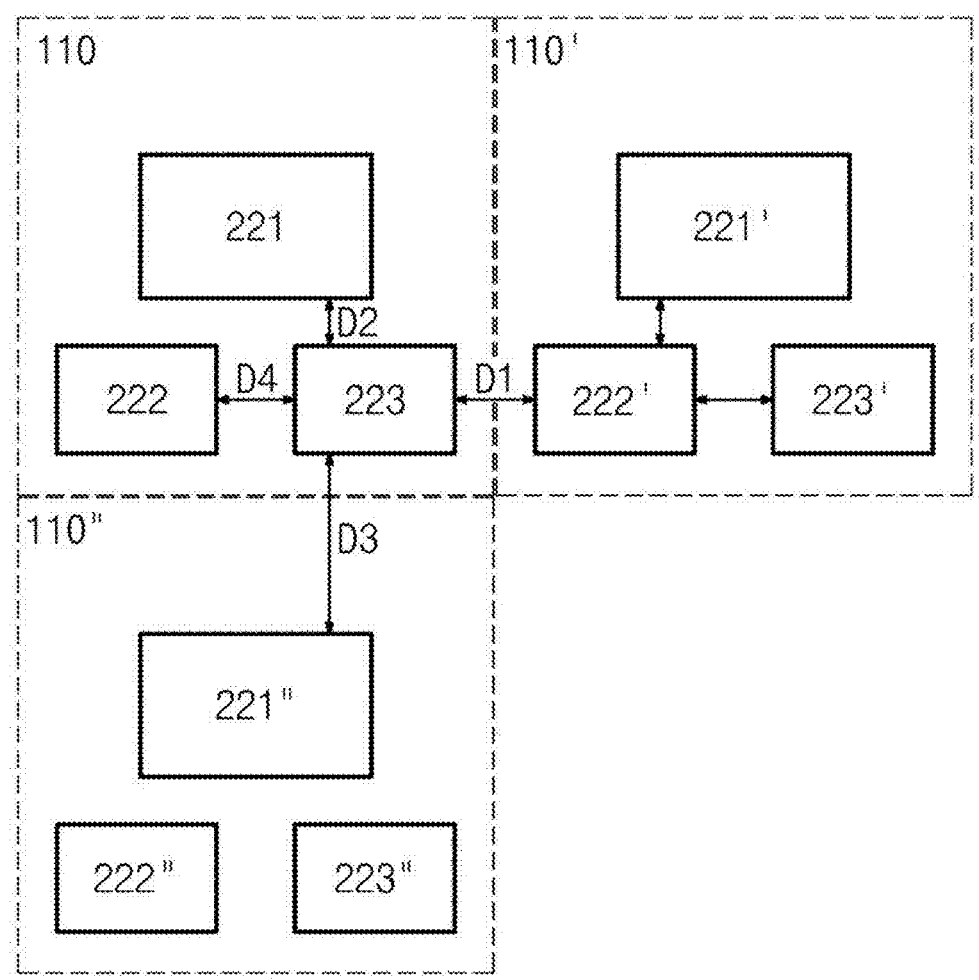
FIGS. 7A and 7B are plan views illustrating a pixel according to exemplary embodiments.
Figure 7B:
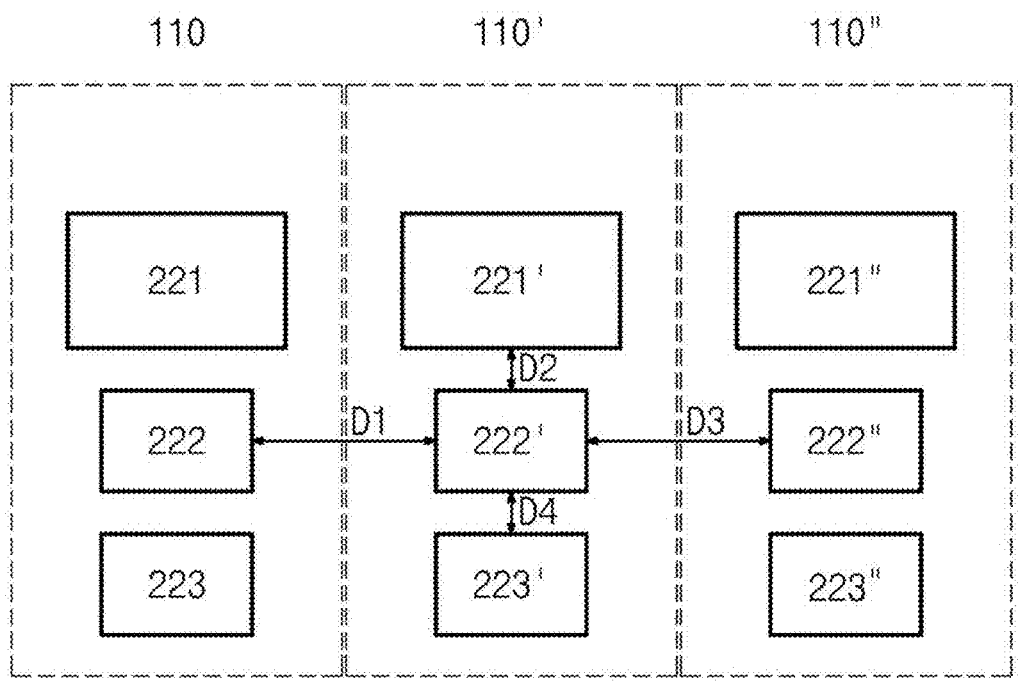

FIGS. 7A and 7B are plan views illustrating pixels according to an exemplary embodiment.

According to an exemplary embodiment, the light non-transmissive layer includes a plurality of openings, each of which is provided with one light emitting cell. In addition, a distance between the light emitting cells provided in the same pixel is shorter than a distance between the light emitting cells provided in each of different light emitting cell pixels.

When the light emitting cells are provided in the openings, a distance between the light emitting cells and the opening sidewalls is relatively small, as compared to a distance between the openings. Hereinafter, the distance will be described with reference to a distance between the different openings. However, the following descriptions of the distance between the openings may be equally applicable to that of the distance between the light emitting cells. The distance between the light non-transmissive layer sidewall and the light emitting cell may be narrowed to about 2 μm or less, because the distance is a relatively very short distance.

Each pixel 110, 110', or 110" is provided with the first to third light emitting cells. The first light emitting cell emits light having a first wavelength, and the second light emitting cell emits light having a second wavelength different from the first wavelength. In addition, the third light emitting cell emits light having a third wavelength different from the first wavelength. Accordingly, in some exemplary embodiments, the second wavelength and the third wavelength may be the same, and in this case, a wavelength converter is provided on at least one of the second light emitting cell and the third light emitting cell.

Referring to FIG. 7A, the first pixel 110, the second pixel 110', and the third pixel 110" may be respectively provided with first light emitting cells, second light emitting cells, and third light emitting cells, and each pixel 110, 110', or 110" may be arranged in a triangle shape. Openings 221, 222, and 223 are provided in the first pixel 110, openings 221', 222', and 223' are provided in the second pixel 110', and openings 221", 222", and 223" is provided in the third pixel 110".

In this case, the shortest distance between each of the openings 221, 222, and 223 located in the first pixel 110 is shorter than the shortest distance between one opening located in the first pixel 110 and the closest opening of the other pixels 110' and 110". For example, a second distance D2 and a fourth distance D4 is less than a first distance D1 and a third distance D3. In this case, the second distance D2 refers to a distance between the first opening 221 and the third opening 223, and the fourth distance D4 refers to a distance between the second opening 222 and the third opening 223. In addition, the first distance D1 refers to a distance between the third opening 223 of the first pixel 110 and the second opening 222' of the second pixel 110', and the third distance D3 refers to a distance between the third opening 223 of the first pixel 110 and the first opening 221" of the third pixel 110".

Accordingly, light emitted from each of the openings 221, 222, and 223 located in the first pixel 110 may be mixed relatively easily, and thus, white light having high purity may be implemented. However, light emitted from the first pixel 110 and the second pixel 110' or light emitted from the first pixel 110' and the third pixel 110", which are different pixels, may not be mixed each other. Accordingly, the display apparatus according to an exemplary embodiment may emit high-purity white light, while preventing color variation depending on viewing angles, at which the display apparatus is viewed.

Referring to FIG. 7B, each of the first pixel 110, the second pixel 110', and the third pixel 110" are provided with the first light emitting cells 221, 221', and 221", the second light emitting cells 222, 222', and 222", and the third light emitting cells 223, 223', and 223". The first to third light emitting cells in each pixel 110, 110', or 110" are sequentially arranged side by side in one direction, and the distance between the first light emitting cell and the second light emitting cell included in one pixel and the distance between the second light emitting cell and the third light emitting cell included in one pixel is less than a distance between the different pixels.

For example, the first light emitting cells 221, 221', and 221", the second light emitting cells 222, 222', and 222", and the third light emitting cells 223, 223', and 223" may be sequentially arranged side by side in each pixel 110, 110', and 110".

More particularly, in FIG. 7B, the second distance D2 and the fourth distance D4 are less than the first distance D1 and the third distance D3. In this case, the second distance D2 refers to the distance between the first opening 221' and the second opening 222' of the second pixel 110', and the fourth distance refers to the distance between the second opening 222' and the third opening 223' of the second pixel 110'. In addition, the first distance D1 refers to the distance between the second opening 222 of the first pixel 110 and the second opening 222' of the second pixel 110' and the third distance D3 refers to the distance between the second opening 222' of the second pixel 110' and the second opening 222" of the third pixel 110".

As described above, because the distance from the light non-transmissive layer sidewall forming the opening to the light emitting cell is relatively small compared to the distance between the openings, features regarding the distance between the openings described above may be equally applied to the features regarding the distance between the light emitting cells.

Because the distance between the openings or the light emitting cells provided in the same pixel is less than the distance between the openings or the light emitting cells provided in the different pixels, light emitted from the openings located in the same pixel may be mixed relatively easily, and thus, high-purity white light may be implemented. However, light emitted from the first pixel 110 and the second pixel 110' or the second pixel 110' and the third pixel 110", which are different pixels, may not be mixed with each other. Accordingly, the display apparatus according to the illustrated exemplary embodiment may emit the high-purity white light, while preventing color variation depending on the viewing angle, at which the display apparatus is viewed.

Furthermore, the distance between the light emitting cells provided in the same pixel may vary depending on types of lights emitted from the light emitting cells.

In particular, when the first light emitting cell emits red light, the second light emitting cell emits green light, and the third light emitting cell emits blue light, the distance between the first light emitting cell, the second light emitting cell, and the third light emitting cell may establish the following relationships.

First, the distance between the first light emitting cell and the second light emitting cell may be equal to the distance between the first light emitting cell and the third light emitting cell. In addition, the distance between the first light emitting cell and the second light emitting cell may be different from the distance between the second light emitting cell and the third light emitting cell.

The above-described distance relationship considers characteristics of the light emitting cells which emit light having the different wavelengths. As the light emitting cells are arranged as described above, undesired color mixing may be prevented while implementing high-purity white light.

According to exemplary embodiments, the display apparatus having the above-described structure may be implemented in various forms. FIGS. 8A to 8D are cross-sectional views of a display apparatus according to exemplary embodiments.

Figure 8A:
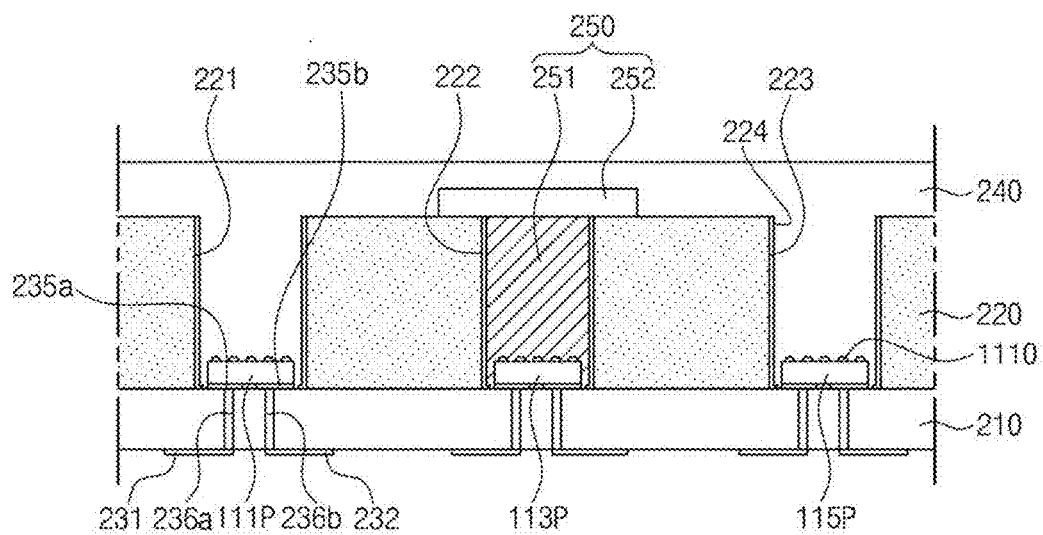
FIGS. 8A, 8B, 8C, and 8D are cross-sectional views illustrating a display apparatus according to exemplary embodiments.

Referring to FIG. 8A, a reflective layer 224 may be provided in the openings 221, 222, and 223. The reflective layer 224 is provided to cover sidewalls of the partition wall 220 defining the opening 223. In addition, the reflective layer 224 may be provided to cover a part of the substrate 210. In an exemplary embodiment, even when the part of the substrate 210 is covered by the reflective layer 224, the reflective layer 224 and the light emitting cell 115P are not in contact with each other.

When the reflective layer 224 is provided on the sidewall of the partition wall 220, a distance between each light emitting cell provided in the same pixel and the sidewall of the opening may be less than about 5 µm. In this case, since the reflective layer 224 reflects light, light emitted from the light emitting cells may not pass through the partition wall 220.

The reflective layer 224 may include metal, such as silver (Ag), aluminum (Al), copper (Cu), platinum (Pt), gold (Au), and the like. The reflective layer 224 may be formed using various patterning methods after forming a thin film using chemical vapor deposition (CVD), plasma chemical vapor deposition (PECVD), physical vapor deposition (PVD), atomic layer deposition (ALD), or the like.

Figure 8B:
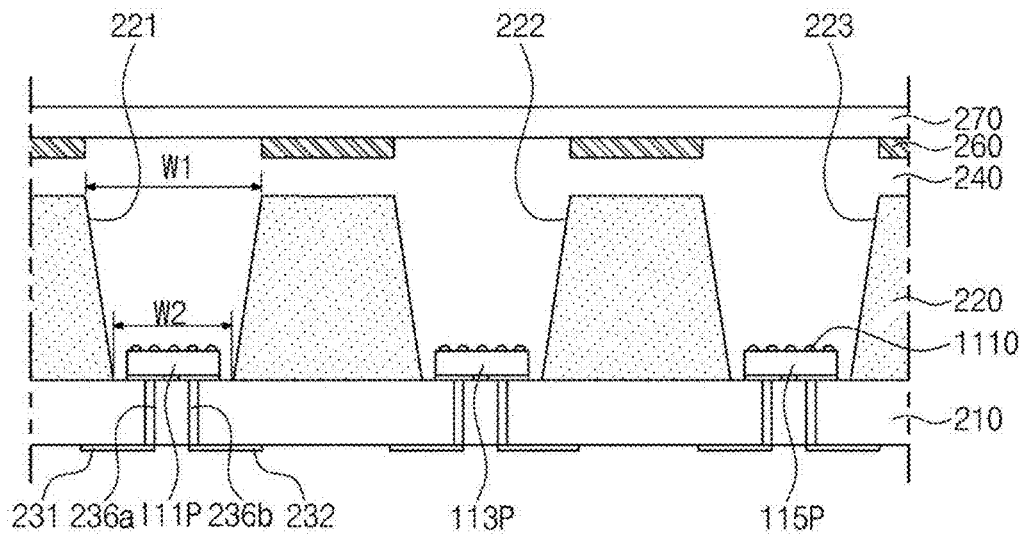

Referring to FIG. 8B, a light shielding unit 260 and a diffusion plate 270 may be further provided on the protective layer 240.

The light shielding unit 260 may be provided not to overlap the openings 221, 222, and 223 on a plane, and may not affect the total amount of light emitted from the light emitting cells 111P, 113P, and 115P. The light shielding unit 260 may be formed of a black photoresist resist. When the light shielding unit 260 is made of a black photoresist resist, patterning using photolithography may be facilitated. However, a material of the light shielding unit 260 may be not limited thereto, and may be formed of various materials.

The light shielding unit 260 is spaced apart from the partition walls 220, and prevents light emitted from the light emitting cells from undesired mixing together.

The diffusion plate 270 refracts and diffuses light emitted from the light emitting cells. Accordingly, the viewing angles of light emitted from the light emitting cells may be increased.

The diffusion plate 270 may be formed using a transparent polymer, such as hydrogen silsesquioxane (HSSQ), methyksilsesquioxane (MSSQ), polyimide, divinyl siloxane bis-benzocyclobutane (DVS-BCS), perfluorocyclobutane (PFCB), polyarylene ether (PAE), polymethylmethacrylate (PMMA), and polydimethylsiloxane (PDMS).

Referring to FIG. 8B, a width of each of the openings 221, 222, and 223 increases in a direction away from the substrate 210. In particular, a lower width W2 of the opening 221 may be less than an upper width W1 of the opening 221. Accordingly, the partition wall 220 provided between the openings 221, 222, and 223 may have a trapezoidal shape having an inverted cross section. More particularly, a width of each partition wall 220 may increase in a direction towards the substrate 210.

As the openings 221, 222, and 223 have the above-described shape, a wider viewing angle may be secured while preventing unnecessary color mixing of light emitted from the light emitting cells 111P, 113P, and 115P.

Figure 8C:
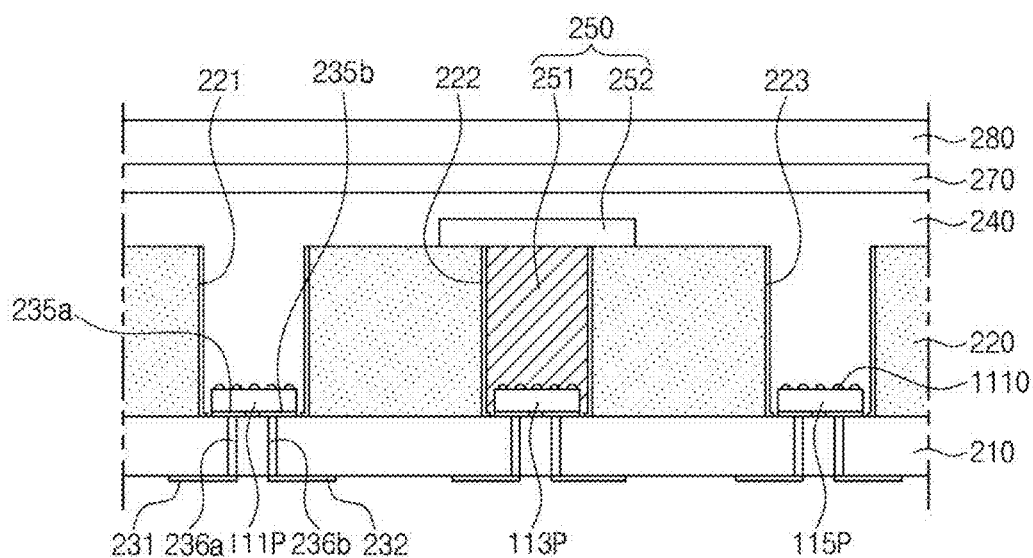

According to FIG. 8C, a window layer 280 is further provided on the diffusion plate 270. The window layer 280 may include glass, acrylic, or the like, and may be optically transparent. As such, the window layer 280 may not affect optical properties of light emitted from the light emitting cells. In addition, the window layer 280 may have flexibility.

The window layer 280 may function as a support while protecting the light emitting cells and the like. In particular, the partition walls 220 may be supported by the window layer 280.

In addition, according to an exemplary embodiment, the first to third light emitting cells 111P, 113P, and 115P are supported by the window layer 280. The plurality of light emitting cells may be supported on the window layer 280, for example, 1 to 100 light emitting cells may be supported on one window layer 280. Accordingly, a plurality of window layers 280, on which the plurality of light emitting cells are supported, may be attached to the substrate 210, and thus, the display apparatus having high resolution may be easily implemented.

Figure 8D:
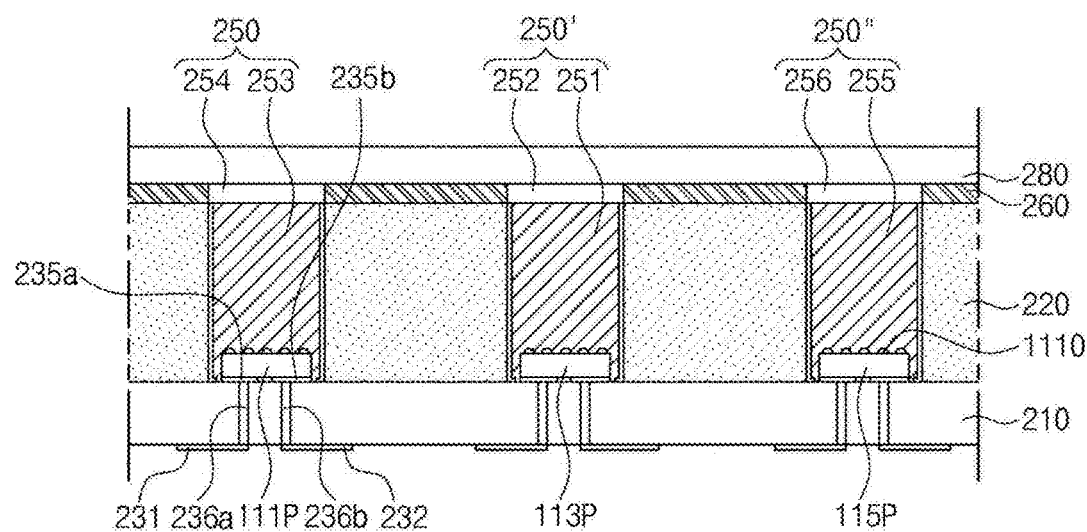

According to FIG. 8D, wavelength converters 250, 250', and 250" are provided on the first to third light emitting cells 111P, 113P, and 115P. In this case, all of the first to third light emitting cells 111P, 113P, and 115P may emit light having the same wavelength. In addition, the semiconductor layers of the first to third light emitting cells 111P, 113P, and 115P may include aluminum gallium indium nitride (AlGaInN), for example.

When the first to third light emitting cells 111P, 113P, and 115P emit light having the same wavelength, the different wavelength converters 250, 250', and 250" are provided on the light emitting cells. These wavelength converters 250, 250', and 250" receive light emitted from the corresponding light emitting cell, and convert light into different wavelengths. Accordingly, the red light, blue light, and green light may be emitted from one pixel.

In an exemplary embodiment, the above-described first to third light emitting cells may be configured in various forms to facilitate mounting and replacement process to provide an optimal luminous efficiency. Hereinafter, terms such as "first", "second", "third", and the like may be given to components other than those in the above-described exemplary embodiments.

Figure 9:
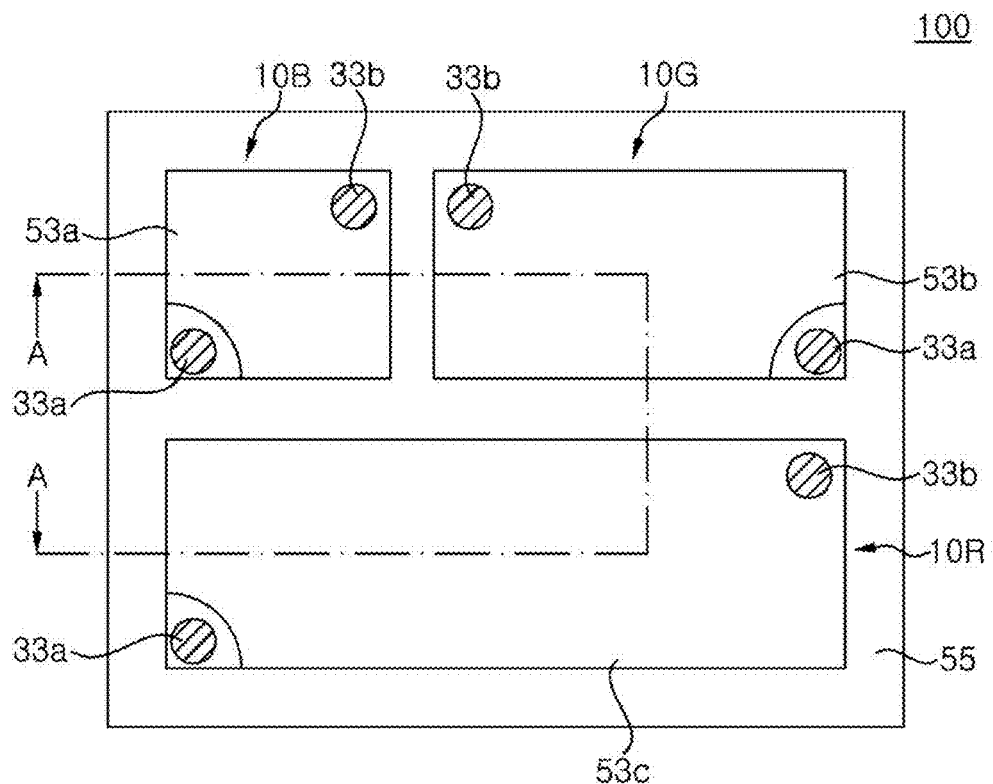
FIG. 9 is a schematic plan view of a light emitting device according to an exemplary embodiment.
Figure 10:
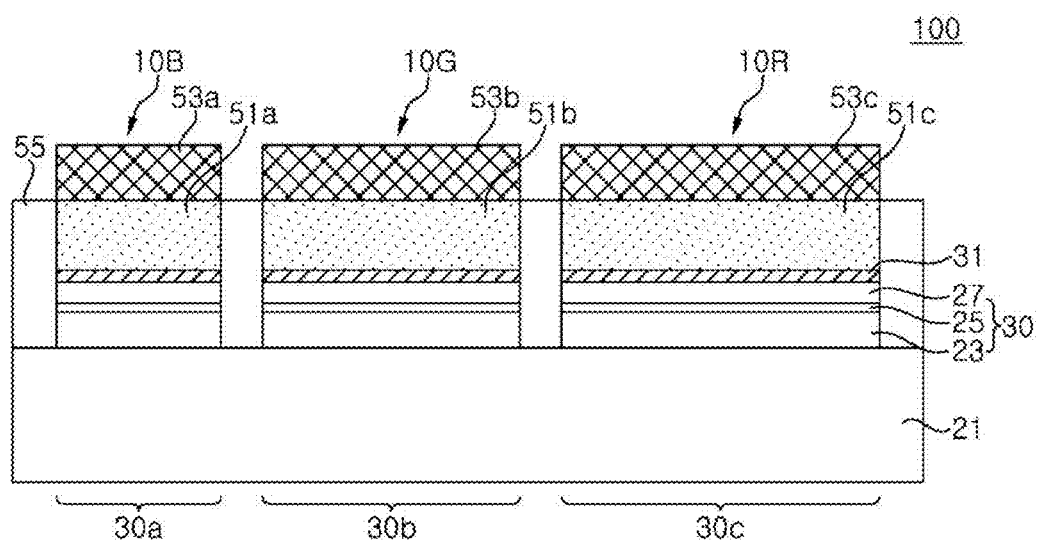
FIG. 10 is a schematic cross-sectional view taken along line A-A of FIG. 9.

FIG. 9 is a schematic plan view illustrating the pixel 100 according to an exemplary embodiment, and FIG. 10 is a schematic cross-sectional view taken along line A-A of FIG. 9.

Referring to FIGS. 9 and 10, the pixel 100, more particular, a light emitting device may include a substrate 21, a first light emitting cell 30a, a second light emitting cell 30b, a third light emitting cell 30c, a transparent electrode layer 31, pads 33a and 33b, a first wavelength converter 51a, a second wavelength converter 51b, a third wavelength converter 51c, a first color filter 53a, a second color filter 53b, a third color filter 53c, and a partition wall 55. Each of the first to third light emitting cells 30a, 30b, and 30c includes a first conductivity type semiconductor layer 23, an active layer 25, and a second conductivity type semiconductor layer 27. In addition, the pixel 100 includes sub-pixels 10B, 10G, and 10R, and the sub-pixels 10B, 10G, and 10R include the light emitting cells 30a, 30b, and 30c, and the wavelength converters 51a, 51b, and 51c, and the color filters 53a, 53b, and 53c, respectively.

The substrate 21 is not particularly limited as long as the substrate 21 is capable of growing a gallium nitride based semiconductor layer thereon. For example, the substrate 21 may include a sapphire substrate, a gallium nitride substrate, a SiC substrate, and the like, and may be a patterned sapphire substrate. The substrate 21 may have substantially a rectangular or square shape as shown in the plan view of FIG. 9, but the inventive concepts are not limited thereto. The size of the substrate 21 may be determined depending on the size of the required pixel. For example, the size of the long side of the substrate 21 may be about 400 μm or less, and further, may be about 100 μm or less.

The first to third light emitting cells 30a, 30b, and 30c are spaced apart from one another. As shown in FIG. 9, the first to third light emitting cells 30a, 30b, and 30c have different areas. The second light emitting cell 30b has a greater area than the first light emitting cell 30a, and the third light emitting cell 30c has a greater area than the second light emitting cell 30b. The areas of the first to third light emitting cells 30a, 30b, and 30c may be determined in consideration of light conversion efficiency of the wavelength converters 51a, 51b, and 51c, which will be described in more detail later.

The first to third light emitting cells 30a, 30b, and 30c may be disposed adjacent to one another. In particular, the first light emitting cell 30a may be disposed adjacent to the second and third light emitting cells 30b and 30c, the second light emitting cell 30b may be disposed adjacent to the first and third light emitting cells 30a and 30c, and the third light emitting cell 30c may be disposed adjacent to the first and second light emitting cell 30a or 30b. As shown in FIG. 9, the first and second light emitting cells 30a and 30b may be arranged along a long axis of the third light emitting cell 30c. However, the inventive concepts are not limited thereto and may be variously arranged in other forms. For example, one light emitting cell may be disposed between two other light emitting cells. In addition, the first to third light emitting cells 30a, 30b, and 30c may have substantially a rectangular shape, but may have various shapes in other exemplary embodiments.

Each of the first to third light emitting cells 30a, 30b, and 30c includes the first conductivity type semiconductor layer 23, the active layer 25, and the second conductivity type semiconductor layer 27. The first conductivity type semiconductor layer 23 is disposed on the substrate 21. The first conductivity type semiconductor layer 23 is a layer grown on the substrate 21, and may be a gallium nitride based semiconductor layer doped with impurities, such as Si.

The active layer 25 and the second conductivity type semiconductor layer 27 are disposed on the first conductivity type semiconductor layer 23. The active layer 25 is disposed between the first conductivity type semiconductor layer 23 and the second conductivity type semiconductor layer 27. The active layer 25 and the second conductivity type semiconductor layer 27 may have an area less than the size of the first conductivity type semiconductor layer 23. The active layer 25 and the second conductivity type semiconductor layer 27 may be partially removed to expose a part of the first conductivity type semiconductor layer 23.

The active layer 25 may have a single quantum well structure or a multiple quantum well structure. Composition and thickness of a well layer in the active layer 25 determines the wavelength of light emitted. In particular, the composition of the well layer of the active layer may be adjusted to emit ultraviolet or blue light. In the illustrated exemplary embodiment, each active layer 25 of the first light emitting cell 30a, the second light emitting cell 30b, and the third light emitting cell 30c is grown on the same substrate 21 under the same conditions, and has the same composition and thickness, thereby emitting light having the same wavelength.

The second conductivity type semiconductor layer 27 may be a gallium nitride-based semiconductor layer doped with p-type impurities, for example, Mg. Each of the first conductivity type semiconductor layer 23 and the second conductivity type semiconductor layer 27 may be a single layer, without being limited thereto, and in some exemplary embodiments, may be a multilayer or a superlattice layer. The first conductivity type semiconductor layer 23, the active layer 25, and the second conductivity type semiconductor layer 27 may be formed and grown on the substrate 21 using metal organic chemical vapor deposition (MOCVD) or molecular beam epitaxy (MBE), for example.

The transparent electrode layer 31 is disposed on the second conductivity type semiconductor layer 27 to be in ohmic contact with the second conductivity type semiconductor layer 27. For example, the transparent electrode layer 31 may include Ni/Au, ITO, or ZnO.

The first pad 33a and the second pad 33b are disposed on the first to third light emitting cells 30a, 30b, and 30c, respectively. As shown in FIG. 9, the first pads 33a and the second pads 33b may be disposed near an edge of the substrate 21, and thus, when mounted on a circuit board or the like, the first pads 33a and the second pads 33b may be easily connected to wires. The first pad 33a is electrically connected to the first conductivity type semiconductor layer 23, and the second pad 33b is electrically connected to the second conductivity type semiconductor layer 27. The first pad 33a may be disposed on the first conductivity type semiconductor layer 23 exposed by partially removing the second conductivity type semiconductor layer 27 and the active layer 25, and the second pad 33b may be disposed on the transparent electrode layer 31.

The first wavelength converter 51a is disposed on the first light emitting cell 30a, the second wavelength converter 51b is disposed on the second light emitting cell 30b, and the third wavelength converter 51c is disposed on the third light emitting cell 30c. The first to third wavelength converters 51a, 51b, and 51c may be disposed on the transparent electrode layer 31, respectively.

The first wavelength converter 51a converts the wavelength of light emitted from the first light emitting cell 30a, the second wavelength converter 51b converts the wavelength of light emitted from the second light emitting cell 30b, and the third wavelength converter 51c converts the wavelength of light emitted from the third light emitting cell 30c. The second wavelength converter 51b converts light into a longer wavelength than the first wavelength converter 51a, and the third wavelength converter 51c converts light into a longer wavelength than the second wavelength converter 51b. For example, when the first to third light emitting cells 30a, 30b, and 30c emit ultraviolet light, the first wavelength converter 51a may convert the ultraviolet light into the blue light, the second wavelength converter 51b may convert the ultraviolet light into the green light, and the third wavelength converter 51c may convert the ultraviolet light into the red light.

The first color filter 53a, the second color filter 53b, and the third color filter 53c are disposed on the first to third wavelength converters 51a, 51b, and 51c, respectively, to filter light emitted from the wavelength converters. For example, the first color filter 53a filters light other than the blue light, the second color filter 53b filters light other than the green light, and the third color filter 53c filters light other than the red light. The first to third color filters 53a, 53b, and 53c may improve color purity of the blue light, green light, and red light.

In the illustrated exemplary embodiment, the active layer 25 is exemplarily described as emitting ultraviolet light, however, in some exemplary embodiments, the active layer 25 may emit blue light. In this case, the first wavelength converter 51a may be omitted, and a transparent resin may be disposed in place of the first wavelength converter 51a. The second wavelength converter 51b converts the blue light into the green light, and the third wavelength converter 51c converts the blue light into the red light.

The partition wall 55 is disposed between the first to third light emitting cells 30a, 30b, and 30c. The partition wall 55 may also surround each of the light emitting cells. The partition wall 55 may also be disposed between the wavelength converters 51a, 51b, and 51c.

The partition wall 55 blocks light emitted from one light emitting cell from traveling to the other light emitting cell to prevent optical interference between the sub-pixels 10B, 10G, and 10R. The partition wall 55 may substantially fill an area between the light emitting cells, without being limited thereto. The partition wall 55 may be formed of a white resin or a photosensitive solder resist capable of reflecting light.

The pixel according to the illustrated exemplary embodiment has three sub-pixels 10B, 10G, and 10R, and these sub-pixels are fixed on the substrate 21. For example, the sub-pixel 10B may implement the blue light by the light emitting cell 30a or a combination of the first light emitting cell 10a and the first wavelength converter 51a, the sub-pixel 10G may implement the green light by a combination of the light emitting cell 30b and the second wavelength converter 51b, and the sub-pixel 10R may implement the red light by a combination of the third light emitting cell 30c and the third wavelength converter 51c.

According to an exemplary embodiment, three sub-pixels 10B, 10G, and 10R may be mounted on a circuit board or the like in addition to the substrate 21. In a conventional micro LED, because individual sub-pixels are mounted, the number of manufacturing process is large and the mounting process is difficult. However, according to an exemplary embodiment, because the pixel includes three sub-pixels to implement one light emitting device, the size of the light emitting device is relatively greater than that of the micro LED, and thus, the number of mounting processes may be reduced and mounting process may be facilitated.

The first to third light emitting cells 30a, 30b, and 30c occupy different areas. Further, the wavelength converters 51a, 51b, and 51c disposed on these light emitting cells also occupy different areas. A relative area of the light emitting cells may be closely related to the light conversion efficiency of the wavelength converters, and may also be related to the color filtering efficiency of the color filters 53a, 53b, and 53c.

The wavelength converters may include a phosphor. For example, beta sialon (SiAlON) is suitable for emitting the green light, and CASN (CaAlSiN) series of phosphors are suitable for emitting the red light.

However, the phosphor does not convert all the blue light to the green light or the red light, and there is constant light conversion efficiency for each phosphor. In particular, the red phosphor converting the ultraviolet light of the same wavelength or the blue light into the red light has a lower light conversion efficiency than the green phosphor converting the ultraviolet light or blue light into the green light. Moreover, the red light also has lower visibility than the green light. Therefore, when the first to third light emitting cells 30a, 30b, and 30c are formed to have the same area, the third light emitting cell 30c of the sub-pixel 10R which implements the red light should be driven under a higher current density to implement sensitivity similar to that of other sub-pixels. The second light emitting cell 30b of the sub-pixel 10G which implements the green light should also be driven under a higher current density than the first light emitting cell 30a. More particularly, in general, the current density necessary for implementing an image is different for each light emitting cell, and thus, the first to third light emitting cells 30a, 30b, and 30c may not be driven at an optimal light emission efficiency condition.

Accordingly, the sizes of the light emitting cells according to an exemplary embodiment may be different from one another to allow the current density for driving the light emitting cells to be the same or similar as each other, and thus, the light emitting cells may be driven with the optimal light emission efficiency condition.

The relative areas of the first to third light emitting cells 30a, 30b, and 30c may be determined in consideration of the relative light conversion efficiency of the first to third wavelength converters 51a, 51b, and 51c. As the light conversion efficiency of one wavelength converter is smaller, the area of the light emitting cell corresponding to the one wavelength converter may be larger.

For example, when the first to third light emitting cells 30a, 30b, and 30c emit the blue light, the first wavelength converter 51a may be omitted, and the area ratios of the second light emitting cell 30b and the third light emitting cell 30c with regard to the first light emitting cell 30a may be inversely proportional to the light conversion efficiency of the second wavelength converter 51b and the light conversion efficiency of the third wavelength converter 51c, respectively. More particularly, when the second wavelength converter 51b includes beta sialon and the third wavelength converter includes CASN, the relative area ratio of the first light emitting cell 30a, the second light emitting cell 30b, and the third light emitting cell 30c may be 1:2:7.

In addition, when the first to third light emitting cells 30a, 30b, and 30c emit ultraviolet lights, the area ratios of the second light emitting cell 30b and the third light emitting cell 30c with regard to the first light emitting cell 30a may be inversely proportional to the light conversion efficiency of the second wavelength converter 51b and the light conversion efficiency of the third wavelength converter 51c, with regard to the first wavelength converter 51a, respectively.

The areas of the light emitting cells are described above as being determined in consideration of the light conversion efficiency of the wavelength converters, but when the filtering efficiency of the first to third color filters 53a, 53b, 53c is different from one another, the areas of the light emitting cells may be determined in consideration of filtering efficiency difference.

According to the illustrated exemplary embodiment, the areas of the first to third light emitting cells 30a, 30b, and 30c may be different from one another to drive the light emitting cells under the same current density. As such, the current density for driving the light emitting cells may be set to the optimum condition, thereby improving the light emitting efficiency.

Figure 11:
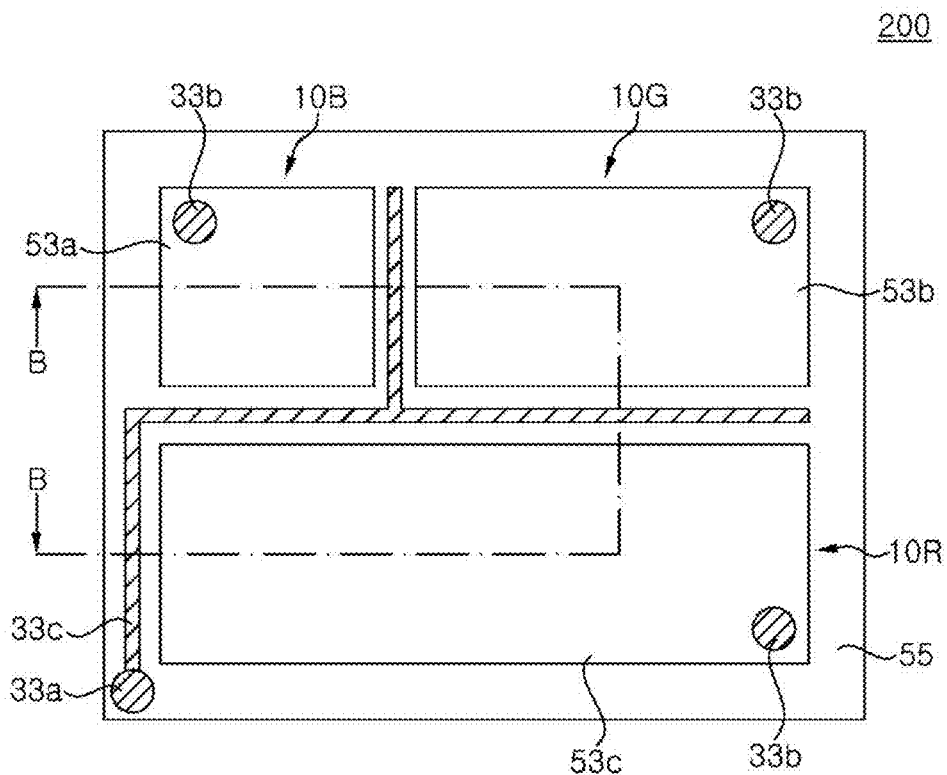
FIG. 11 is a schematic plan view of a light emitting device according to another exemplary embodiment.
Figure 12:
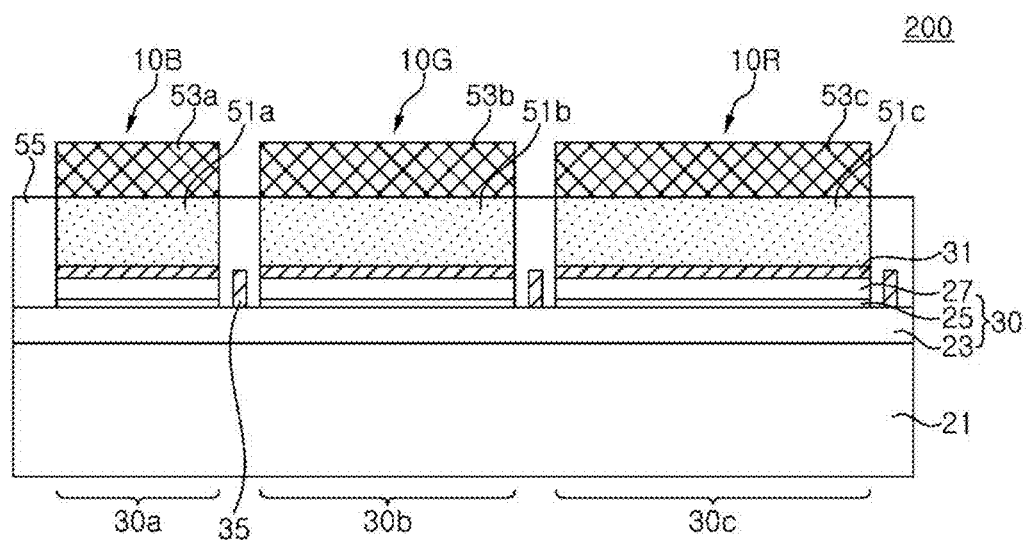
FIG. 12 is a schematic cross-sectional view taken along line B-B of FIG. 11.

FIG. 11 is a schematic plan view of a light emitting device 200 according to another exemplary embodiment, and FIG. 12 is a schematic cross-sectional view taken along line B-B of FIG. 11.

Referring to FIGS. 11 and 12, the light emitting device 200 according to the illustrated exemplary embodiment is substantially similar to the light emitting device 100 described with reference to FIGS. 9 and 10, but there is a difference in that the first to third light emitting cells 30a, 30b, and 30c share the first conductivity type semiconductor layer 23. In particular, the first conductivity type semiconductor layer 23 of the first light emitting cell 30a, the first conductivity type semiconductor layer 23 of the second light emitting cell 30b, and the first conductivity type semiconductor layer 23 of the third light emitting cell 30c are continuously connected to one another.

The first pad 33a may be formed on the shared first conductivity type semiconductor layer 23, and thus, the number of the first pads 33a may be reduced in comparison with the previous exemplary embodiment, thereby securing the light emitting areas.

Furthermore, an extension part 33c may extend from the first pad 33a. The extension part 33c may extend to an area between the light emitting cells. The extension part 33c may be disposed to surround each of the light emitting cells, but may be disposed at some edges of each light emitting cell, as shown in FIG. 11. In particular, when the second pad 33b is disposed near one corner of the light emitting cell, the extension part 33c may be disposed adjacent to edges away from the one corner, and thus, the current may be prevented from being concentrated on a specific portion of the light emitting cell to improve the light efficiency.

Figure 13:
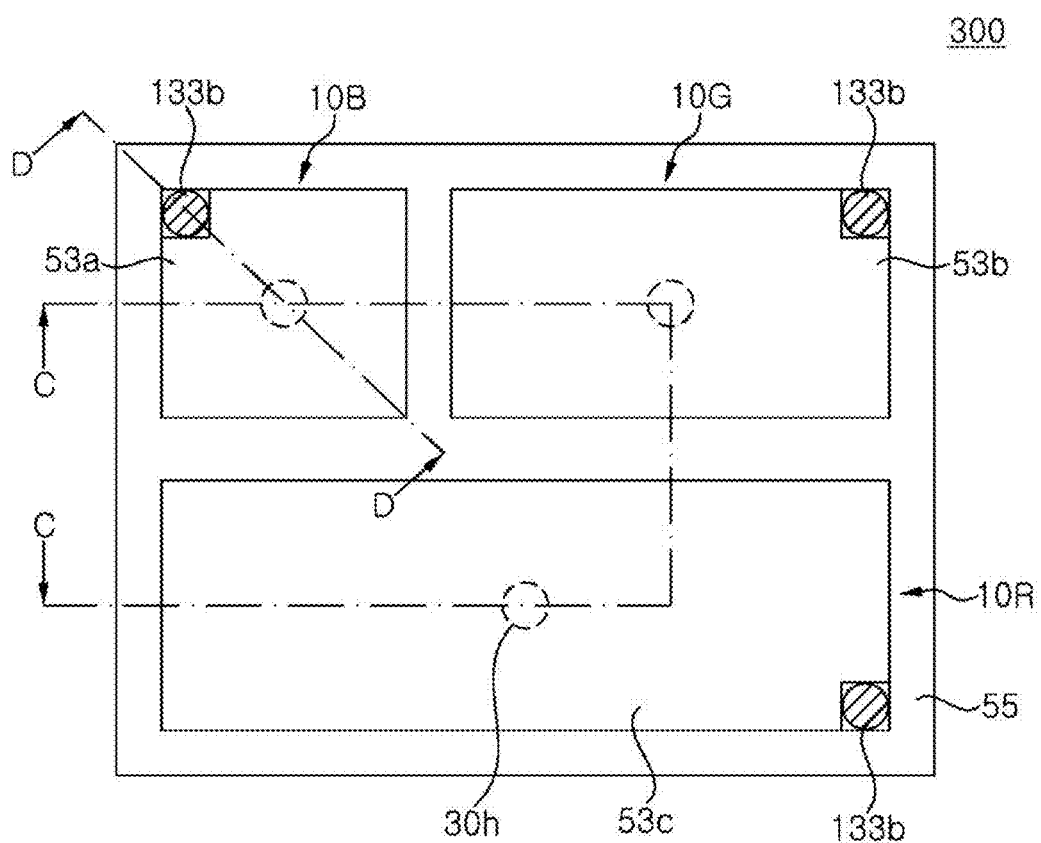
FIG. 13 is a schematic plan view of a pixel according to another exemplary embodiment.
Figure 14:
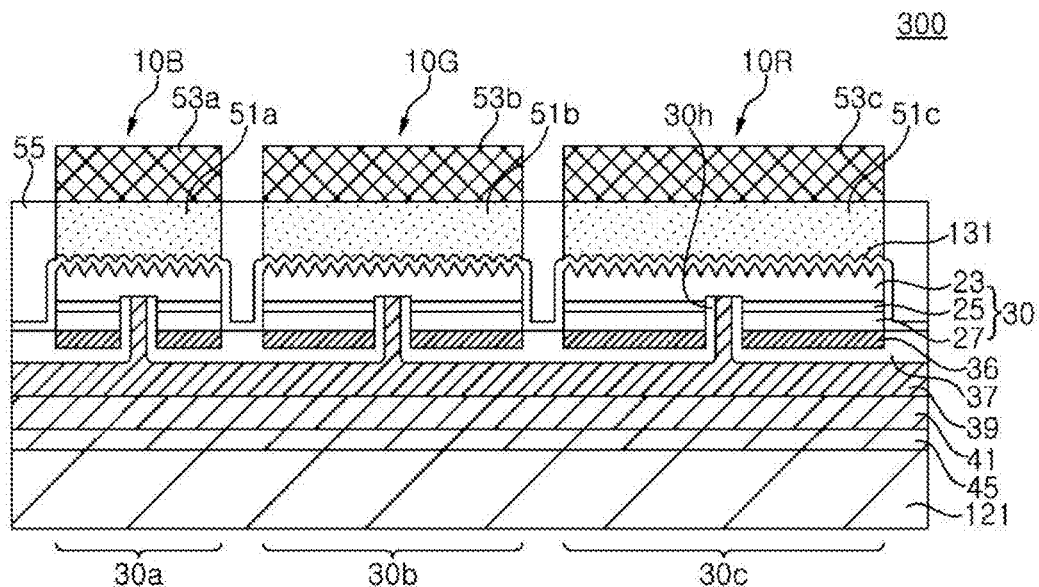
FIG. 14 is a schematic cross-sectional view taken along line C-C of FIG. 13.
Figure 15:
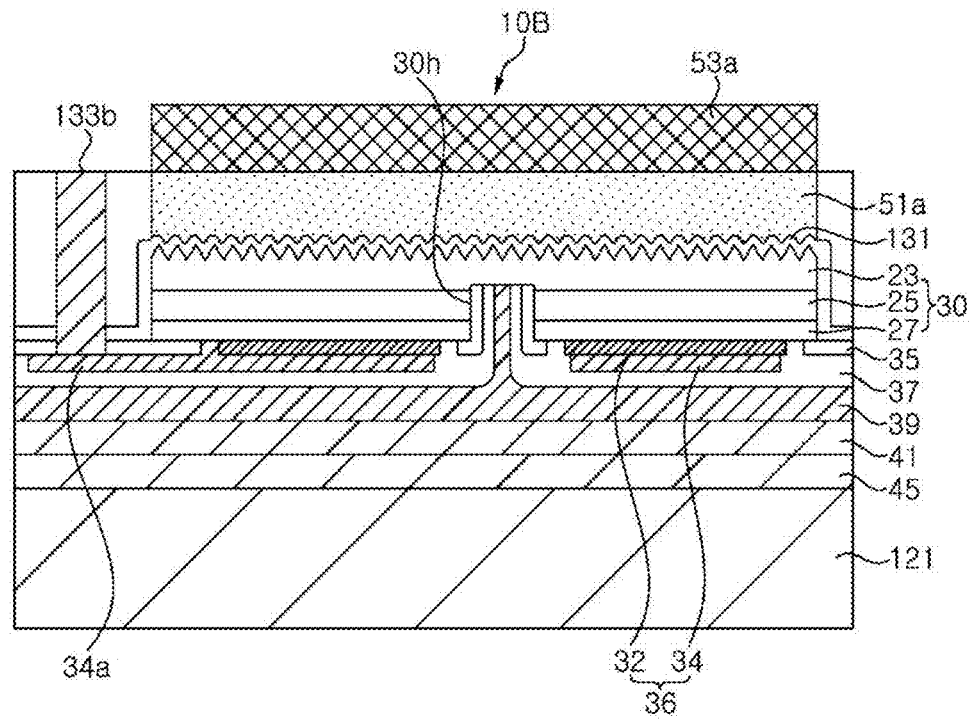
FIG. 15 is a schematic enlarged cross-sectional view taken along line D-D of FIG. 13.

FIG. 13 is a schematic plan view of a light emitting device 300 according to another exemplary embodiment, FIG. 14 is a schematic cross-sectional view taken along line C-C of FIG. 13, and FIG. 15 is a schematic enlarged cross-sectional view taken along line D-D of FIG. 13.

Referring to FIGS. 13 to 15, the light emitting device 300 according to the illustrated exemplary embodiment includes the light emitting cells 30a, 30b, and 30c each having a vertical structure, which is different from the light emitting device 100 or 200 having the light emitting cells of a horizontal structure.

The light emitting device 300 according to the illustrated exemplary embodiment includes a support substrate 121, the first light emitting cell 30a, the second light emitting cell 30b, the third light emitting cell 30c, an anti-reflection layer 131, pads 133b, the first wavelength converter 51a, the second wavelength converter 51b, the third wavelength converter 51c, the first color filter 53a, the second color filter 53b, the third color filter 53c, the partition wall 55, a first insulating layer 35, a first electrode 39, a second electrode 36, a second insulating layer 37, a protective metal layer 41, and a bonding metal layer 45. Each of the first to third light emitting cells 30a, 30b, and 30c includes the first conductivity type semiconductor layer 23, the active layer 25, and the second conductivity type semiconductor layer 27. In addition, the light emitting device 300 includes sub-pixels 10B, 10G, and 10R, and each of the sub-pixels 10B, 10G, and 10R includes the light emitting cells 30a, 30b, and 30c, the wavelength converters 51a, 51b, and 51c and the color filters 53a, 53b, and 53c.

The support substrate 121 may be a secondary substrate attached to the compound semiconductor layers that have already been grown, and thus, the support substrate 121 may different from a growth substrate. The support substrate 121 may be a conductive substrate, for example, a metal substrate, or a semiconductor substrate. In order to form the light emitting cells 30a, 30b, and 30c, the first conductivity type semiconductor layer 23, the active layer 25, and the second conductivity type semiconductor layer 27 may be formed on a growth substrate, such as the substrate 21 described above, and after the growth of the support substrate 121, the growth substrate is removed using a peeling technique, such as laser lift-off or chemical lift-off.

The first to third light emitting cells 30a, 30b, and 30c are generally similar to the light emitting cells described above, but are arranged to emit light toward the first conductivity type semiconductor layer 23. In addition, the light emitting cells 30a, 30b, and 30c may have through holes 30h or grooves, which pass through the second conductivity type semiconductor layer 27 and the active layer 25 to expose the first conductivity type semiconductor layer 23.

Because the first conductivity type semiconductor layer 23, the active layer 25, and the second conductivity type semiconductor layer 27 are similar to those already described above, repeated descriptions thereof will be omitted to avoid redundancy.

Roughness may be formed on the surface of the first conductivity type semiconductor layer 23, and the anti-reflection layer 131 may cover the roughness. The anti-reflection layer 131 may also cover side surfaces of the light emitting cells 30a, 30b, and 30c. The roughness may be formed using a wet etching technique, such as light enhanced chemical etching, and the anti-reflection layer 131 may be formed using an atomic layer deposition technique. The anti-reflection layer 131 may have, for example, a layer structure of $SiO_2/Al_2O_3/SiO_2$, and may be formed along topography of the roughness.

As shown in FIG. 15, the first insulating layer 35 is disposed between the first to third light emitting cells 30a, 30b, and 30c and the support substrate 121. The first insulating layer 35 may also cover a side surface of the active layer 25 and a side surface of the second conductivity type semiconductor layer 27, which are exposed in the through hole 30h. The insulating layer 35 exposes a lower surface of the second conductivity type semiconductor layer 27.

The first insulating layer 35 may be a single layer or multiple layers of a silicon oxide film or a silicon nitride film, or may include a distributed Bragg reflector in which insulating layers having different refractive indices are repeatedly stacked. When the insulating layer 35 includes the distributed Bragg reflector, the insulating layer 35 may also include an interface layer between the distributed Bragg reflector and the second conductivity type semiconductor layer 27. The insulating layer 35 may include, for example, $SiO_2$, $MgF_2$, $TiO_2$, or $Nb_2O_5$. For example, the insulating layer 35 may include a distributed Bragg reflector, in which $TiO_2/SiO_2$ or $Nb_2O_5/SiO_2$ is repeatedly stacked on an interface layer of $SiO_2$ or $MgF_2$.

The second electrode 36 may include an ohmic reflective layer 32 and a barrier metal layer 34. The ohmic reflective layer 32 is in ohmic contact with the second conductivity type semiconductor layer 27 exposed through the openings of the insulating layer 35. The ohmic reflective layer 32 may be in contact with the insulating layer 35, however, an edge of the ohmic reflective layer 32 may be spaced apart from the insulating layer 35 as shown in FIG. 15. The ohmic reflective layer 32 may include, for example, a reflective layer, such as Ag, and may include a metal layer for ohmic contact, such as Ni. The ohmic reflective layer 32 may be restrictively disposed in a lower region of the second conductivity type semiconductor layer 27.

The barrier metal layer 34 is disposed between the ohmic reflective layer 32 and the support substrate 121, and covers the ohmic reflective layer 32. The barrier metal layer 34 prevents movement of a metal material, such as Ag, of the ohmic reflective layer 32. The barrier metal layer 34 may cover a side surface of the ohmic reflective layer 32, but as shown in FIG. 15, the barrier metal layer 34 may be disposed on the ohmic reflective layer 32 to expose the side surface of the ohmic reflective layer 32. As the side surface of the ohmic reflective layer 32 is exposed, the ohmic reflective layer 32 may be formed in a relatively large area, and thus, a contact resistance may be reduced to lower a forward voltage. The barrier metal layer 34 may include, for example, Pt, Ni, Ti, W, Au, or an alloy thereof.

The barrier metal layer 34 may also cover the insulating layer 35 inside recesses of the light emitting cells 30a, 30b, and 30c, and is electrically connected to the pad 33b formed in the recesses.

The second insulating layer 37 covers the barrier metal layer 34. The second insulating layer 37 may cover the entire lower surface of the barrier metal layer 34. Further, the second insulating layer 37 may cover the side surface of the barrier metal layer 34 to prevent the side surface of the barrier metal layer 34 from being exposed to the outside.

The second insulating layer 37 may be a single layer or multiple layers of a silicon oxide layer or a silicon nitride layer, or a distributed Bragg reflector repeatedly stacking insulating layers having different refractive indices, for example, $SiO_2/TiO_2$ or $SiO_2/Nb_2O_5$. When the second insulating layer 37 includes the distributed Bragg reflector, the second insulating layer 37 may also include an interface layer between the distributed Bragg reflector and the first insulating layer 35. The first insulating layer 35 may include, for example, $SiO_2$, $MgF_2$, $TiO_2$, or $Nb_2O_5$. For example, the first insulating layer 35 may include a distributed Bragg reflector, in which $TiO_2/SiO_2$ or $Nb_2O_5/SiO_2$ is repeatedly stacked on an interface layer of $SiO_2$ or $MgF_2$.

The first electrode 39 is disposed between the second insulating layer 37 and the support substrate 121, and is electrically connected to the first conductivity type semiconductor layer 23 through the first insulating layer 35 and the second insulating layer 37. The first electrode 39 may be disposed between the second electrode 36 and the support substrate 121, and the first electrode 39 may be connected to the first conductivity type semiconductor layer 23 exposed through the through hole 30h. Further, the first electrode 39 is insulated from the active layer 25 and the second conductivity type semiconductor layer 27 by the first insulating layer 35 and the second insulating layer 37.

The first electrode 39 may include an ohmic layer in ohmic contact with the first conductivity type semiconductor layer 23, and may also include a reflective metal layer. For example, the first electrode 39 may include Cr/Au, and may further include Ti/Ni.

The protective metal layer 41 may cover the lower surface of the first electrode 39. The protective metal layer 41 prevents diffusion of a metal material, such as Sn, from the bonding metal layer 45 to protect the first electrode 39. The protective metal layer 41 may include, for example, Au, and may further include Ti and Ni. The protective metal layer 41 may be formed by, for example, stacking Ti/Ni repeatedly and then stacking Au.

The support substrate 121 may be bonded through the bonding metal layer 45 on the protective metal layer 41. The bonding metal layer 45 may be formed using, for example, AuSn or NiSn. Alternatively, the support substrate 121 may be formed on the protective metal layer 41 using, for example, a plating technique. When the support substrate 121 is a conductive substrate, the support substrate 121 may function as a pad. Accordingly, the first conductivity type semiconductor layers 23 of the first to third light emitting cells 30a, 30b, and 30c may be electrically connected to one another and the support substrate 121 may function as a common electrode.

Each of the light emitting cells 30a, 30b, and 30c may have a recess, in which the first conductivity type semiconductor layer 23, the active layer 25, and the second conductivity type semiconductor layer 27 are removed at one corner portion thereof, and each of the pads 133b may be disposed in the recess to be electrically connected to the barrier metal layer 34.

The first to third wavelength converters 51a, 51b, and 51c and the first to third color filters 53a, 53b, and 53c are disposed on the first to third light emitting cells 30a, 30b, and 30c, respectively, to configure the sub-pixels 10B, 10G, and 10R.

As the first to third wavelength converters 51a, 51b, and 51c and the first to third color filters 53a, 53b, and 53c are similar to those described with reference to FIGS. 9 and 10, repeated descriptions thereof will be omitted to avoid redundancy. Meanwhile, while the wavelength converters 51a, 51b, and 51c in the above exemplary embodiments are disposed on the side of the second conductivity type semiconductor layer 27, because the light emitting cells 30a, 30b, and 30c according to the illustrated exemplary embodiment have a vertical structure, the first to third wavelength converters 51a, 51b, and 51c and the first to third color filters 53a, 53b, and 53c are disposed on the side of the first conductivity type semiconductor layer 23.

The partition wall 55 may be disposed in an area between the light emitting cells 30a, 30b, and 30c, and may surround the light emitting cells. The partition wall 55 may also surround the side of the pad 133b. The partition wall 55 may be a white resin or a photosensitive solder resist having a light reflection function as described above.

In addition, the first to third light emitting cells 30a, 30b, and 30c according to the illustrated exemplary embodiment occupy different areas, which are similar to those described with reference to FIGS. 9 and 10. As such, repeated descriptions thereof will be omitted.

Figure 16:
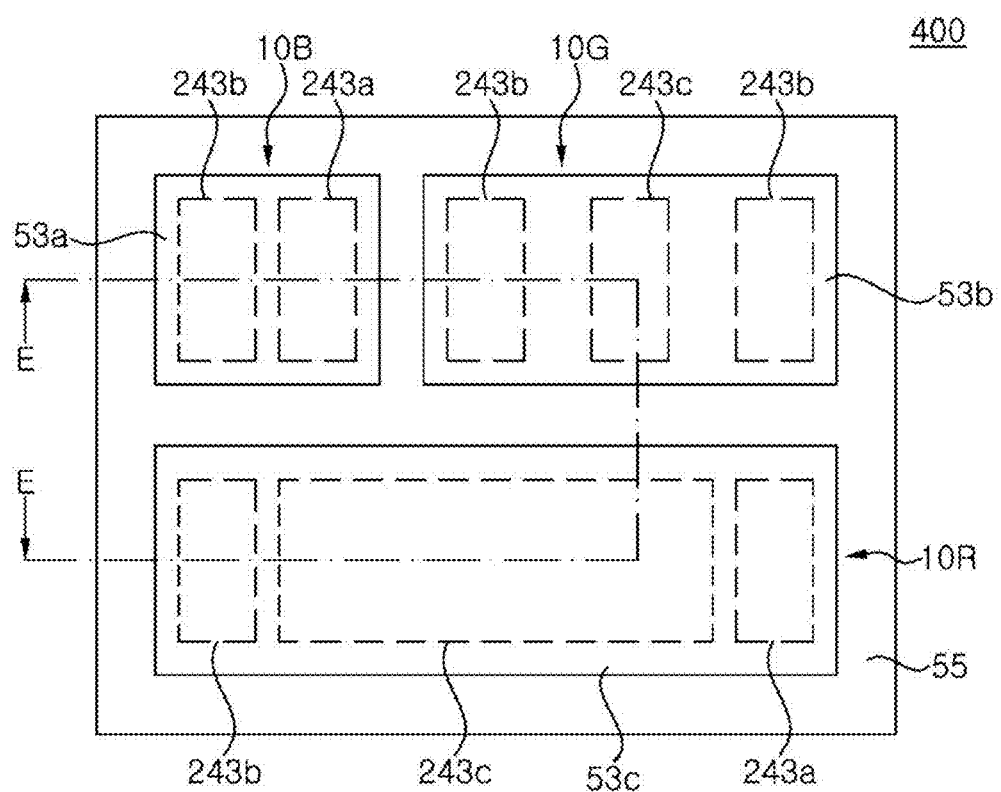
FIG. 16 is a schematic plan view of a pixel according to another exemplary embodiment.
Figure 17:
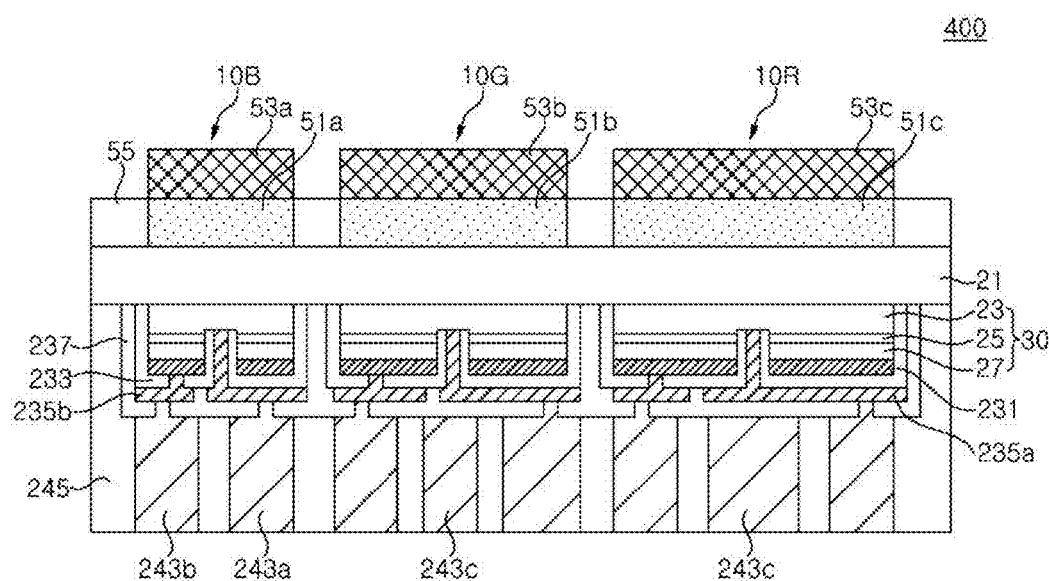
FIG. 17 is a schematic cross-sectional view taken along line E-E of FIG. 16.

FIG. 16 is a schematic plan view of a light emitting device 400 according to another exemplary embodiment, and FIG. 17 is a schematic cross-sectional view taken along line E-E of FIG. 16. The light emitting device 400 according to the illustrated exemplary embodiment is different from the light emitting device of the previous exemplary embodiments in that the light emitting device 400 has a flip structure.

Referring to FIGS. 16 and 17, the light emitting device 400 according to the illustrated exemplary embodiment may include the substrate 21, the first to third light emitting cells, an ohmic reflective layer 281, a first insulating layer 233, pad electrodes 235a and 235b, a second insulating layer 237, the first wavelength converter 51a, the second wavelength converter 51b, the third wavelength converter 51c, the first color filter 53a, the second color filter 53b, the third color filter 53c, and the partition wall 55. The first to third light emitting cells each include the first conductivity type semiconductor layer 23, the active layer 25, and the second conductivity type semiconductor layer 27. In addition, the light emitting device 400 includes the sub-pixels 10B, 10G, and 10R, and the sub-pixels 10B, 10G, and 10R includes the light emitting cells 30, the wavelength converters 51a, 51b, and 51c, and the color filters 53a, 53b, and 53c, respectively.

The substrate 21 is substantially the same as the substrate 21 described above with reference to FIGS. 9 and 10, and thus, repeated descriptions thereof will be omitted. In addition, since the first conductivity type semiconductor layer 23, the active layer 25, and the second conductivity type semiconductor layer 27 are also similar to those of the above exemplary embodiments, repeated descriptions thereof will be omitted.

The light emitting cells are disposed under the substrate 21, and the light emitting cells expose the first conductivity type semiconductor layer 23 through the second conductivity type semiconductor layer 27 and the active layer 25. Because the areas and the stacked structure of these light emitting cells are similar to those of the first to third light emitting cells 30a, 30b, and 30c described in the above exemplary embodiments, repeated descriptions thereof will be omitted.

The ohmic reflective layer 281 is in ohmic contact with the second conductivity type semiconductor layer 27 of each light emitting cell. The ohmic reflective layer 281 may include an ohmic layer and a reflective layer. For example, the ohmic reflective layer 281 may include an ohmic layer, such as Ni or ITO, and a reflective layer, such as Ag or Al. The ohmic reflective layer 281 may also include an insulating layer, such as $SiO_2$, between a transparent oxide layer, such as ITO, and the reflective layer. The reflective layer may be connected to the transparent oxide layer through the insulating layer.

The first insulating layer 233 covers the light emitting cells and covers exposed side surfaces of the second conductive semiconductor layer 27 and the active layer 25. The first insulating layer 233 has openings, which expose the first conductivity type semiconductor layer 23 and the ohmic reflective layer 281. The first insulating layer 233 may be formed of a single layer, such as $SiO_2$ or $Si_3N_4$, without being limited thereto, and may be formed of multiple layers. In particular, the first insulating layer 233 may include a distributed Bragg reflector.

The first pad electrode 235a and the second pad electrode 235b are disposed on the first insulating layer 233. The first pad electrode 235a and the second pad electrode 235b are disposed on each light emitting cell. The first pad electrode 235a is electrically connected to the first conductivity type semiconductor layer 23, and the second pad electrode 235b is electrically connected to the ohmic reflective layer 281. The first pad electrode 235a and the second pad electrode 235b may be formed together in the same process, and thus, may be positioned at the same level. In some exemplary embodiments, the second pad electrode 235b may be omitted.

The second insulating layer 237 covers the first and second pad electrodes 235a and 235b, but includes openings exposing the first and second pad electrodes 235a and 235b. The second insulating layer 237 may be formed of a single layer, such as $SiO_2$ or $Si_3N_4$, without being limited thereto, and may be formed of multiple layers. In particular, the first insulating layer 233 may include a distributed Bragg reflector.

First and second bump pads 243a and 243b are formed on each light emitting cell, and are connected to the first and second pad electrodes 235a and 235b through the openings of the second insulating layer 237. In particular, the first bump pad 243a is connected to the first pad electrode 235a, and the second bump pad 243b is connected to the second pad electrode 235b.

The bump pads 243a and 243b occupy a relatively large area compared to the pads of the above-described exemplary embodiments, and maximum widths of the bump pads 243a and 243b may be greater than at least ½ of minimum width of the light emitting cell. The bump pads 243a and 243b may each have substantially a rectangular shape, but may be not limited thereto, and may each have substantially a circular or elliptical shape. The bump pads 243a and 243b may include Au or AuSn.

A dummy bump pad 243c may be disposed on at least one light emitting cell in addition to the bump pads 243a and 243b. In particular, because the light emitting cells have different areas, the dummy bump pad 243c may be disposed at the light emitting cells having the relatively large areas. The dummy bump pad 243c may be used as a heat dissipation path for dissipating heat generated in the light emitting cells, thereby improving light efficiency of the light emitting device.

A support member 245 may cover side surfaces of the bump pads 243a and 243b. The support member 245 may also cover a side surface of the dummy bump pad 243c. The support member 245 may be formed of a thermosetting or thermoplastic resin.

The first to third wavelength converters 51a, 51b, and 51c are disposed on the substrate 21 to face the light emitting cells. The first to third wavelength converters 51a, 51b, and 51c are disposed on corresponding light emitting cells. In addition, the first to third color filters 53a, 53b, and 53c are disposed on the first to third wavelength converters 51a, 51b, and 51c, respectively. Because the first to third wavelength converters 51a, 51b, and 51c and the first to third color filters 53a, 53b, and 53c are similar to those described above, repeated descriptions thereof will be omitted.

The partition wall 55 may be disposed between the wavelength converters 51a, 51b, and 51c. The partition wall 55 may be formed of white resin or photosensitive solder resist. The partition wall 55 in the above exemplary embodiments has been described as being disposed between the light emitting cells 30a, 30b, and 30c. However, in the illustrated exemplary embodiment, because the partition wall 55 is disposed on the substrate 21, the partition wall 55 is not formed in a region between the light emitting cells. Instead, the first insulating layer 233 may include a distributed Bragg reflector, or the first pad electrode 235a and/or the second pad electrode 235b may be disposed to cover sidewalls of the light emitting cells to prevent the optical interference between the light emitting cells.

According to the illustrated embodiment, the light emitting cells having a flip structure may be used to improve the light emission efficiency of each light emitting cell. Also, in the illustrated exemplary embodiment, the light emitting cells have the different areas, and as described above, the areas of the light emitting cells are determined in consideration of the light conversion efficiency of the wavelength converters.

Figure 18:
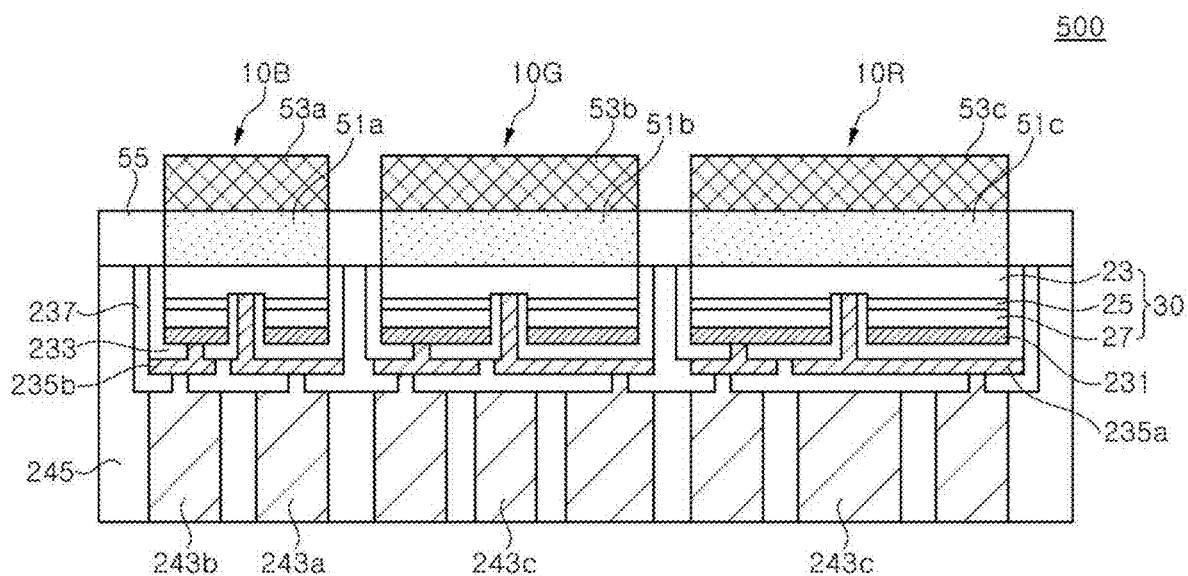
FIG. 18 is a schematic cross-sectional view of a pixel according to another exemplary embodiment.

FIG. 18 is a schematic cross-sectional view of a light emitting device 500 according to another exemplary embodiment.

Referring to FIG. 18, the light emitting device 500 according to the illustrated exemplary embodiment is generally similar to the light emitting device described with reference to FIGS. 16 and 17, but there is a difference in that the substrate 21 is omitted. The first to third wavelength converters 51a, 51b, and 51c are disposed on the light emitting cells instead of being disposed on the substrate 21. In addition, as described with reference to FIGS. 13 to 15, the roughness may be formed on the surface of the first conductivity type semiconductor layer 23 and the anti-reflection layer may cover the surface of the first conductivity type semiconductor layer 23.

In the illustrated exemplary embodiment, the light emitting cells may be supported by the support member 245.

According to the illustrated exemplary embodiment, the substrate 21 may be removed to block the optical interference between adjacent sub-pixels 10B, 10G, and 10R.

Figure 19A:
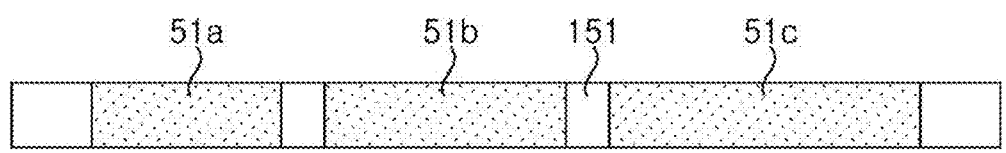
FIGS. 19A and 19B are cross-sectional views illustrating a film including a wavelength converter according to exemplary embodiments.
Figure 19B:
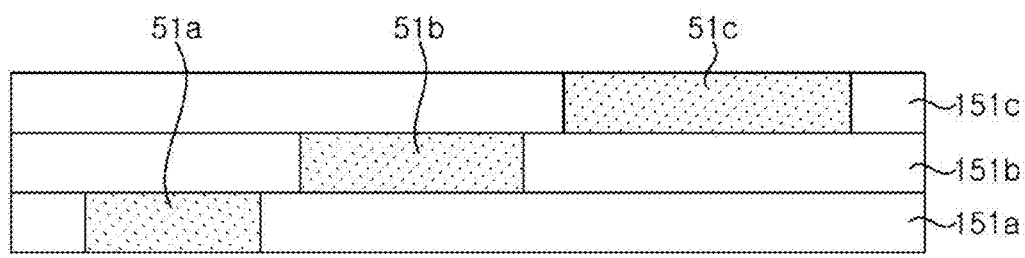

FIGS. 19A and 19B are cross-sectional views illustrating a film including a wavelength converter.

Referring first to FIG. 19A, the first to third wavelength converters 51a, 51b, and 51c in the above exemplary embodiments are described as being spaced apart from one another to be separately attached or formed on the light emitting cells 30a, 30b, and 30c. However, in the illustrated exemplary embodiment, the first to third wavelength converters 51a, 51b, and 51c may be arranged in one layer in one film. A transparent or opaque resin 151 may be disposed in a region between the wavelength converters 51a, 51b, and 51c.

In the illustrated exemplary embodiment, when the light emitting cells emit the blue light, the first wavelength converter 51a may be omitted, and in this case, the transparent resin 151 may be disposed at a position of the first wavelength converter 51a.

Referring to FIG. 19B, the film according to the illustrated exemplary embodiment may be a laminated film of several layers. More particularly, a first layer 151a may include the first wavelength converter 51a, a second layer 151b may include the second wavelength converter 51b, and a third layer 151c may include the third wavelength converter 51c. The first to third layers 151a to 151c may be configured with a combination of the transparent resin 151 and the wavelength converter, respectively. Meanwhile, when the light emitting cells emit the blue light, the first layer 151a may be omitted.

In the above exemplary embodiment, films having various structures may be used and only some of the structures have been exemplarily described.

Figure 20:
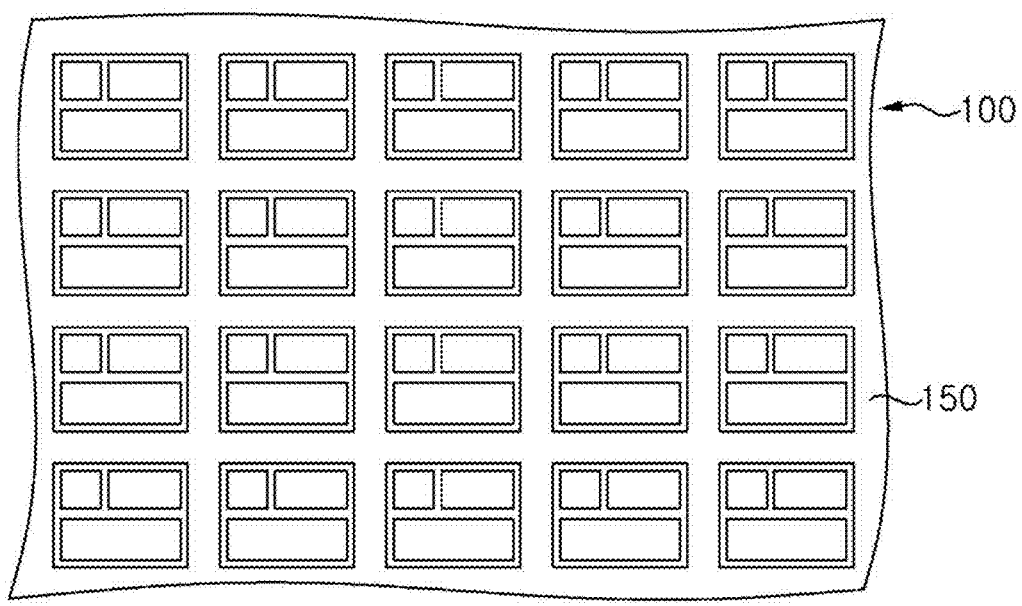
FIG. 20 is a schematic plan view illustrating a display apparatus according to an exemplary embodiment.

FIG. 20 is a schematic plan view illustrating a display apparatus according to an exemplary embodiment.

Referring to FIG. 20, the display apparatus according to the illustrated exemplary embodiment includes a circuit board 150 and the light emitting device 100 arranged on the circuit board 150.

The light emitting device 100 is a light emitting device described with reference to FIGS. 9 and 10, which includes the first to third sub-pixels 10B, 10G, and 10R, and the pads 33a and 33b.

The circuit board 150 has a circuit wire for supplying current to the pads 33a and 33b on the pixel 100, and the pads 33a and 33b are electrically connected to the circuit on the circuit board 150. For example, the pads 33a and 33b may be electrically connected to the circuit board 150 using a bonding wire.

In the illustrated exemplary embodiment, the pixel 100 includes three sub-pixels, and each of the sub-pixels may implement the blue light, green light, and red light, respectively. Therefore, each pixel 100 configures one pixel and an image may be implemented using the light emitting device 100.

In the illustrated exemplary embodiment, the pixel 100 is described as being arranged on the circuit board 150, but the light emitting elements 200, 300, 400 or 500 may be arranged, and various light emitting elements may be mixed and used.

In addition, the light emitting device may be mounted on the circuit board using Au—Au bonding or AuSN bonding in addition to the bonding wire, corresponding to the structure of the light emitting cells.

Figure 21:
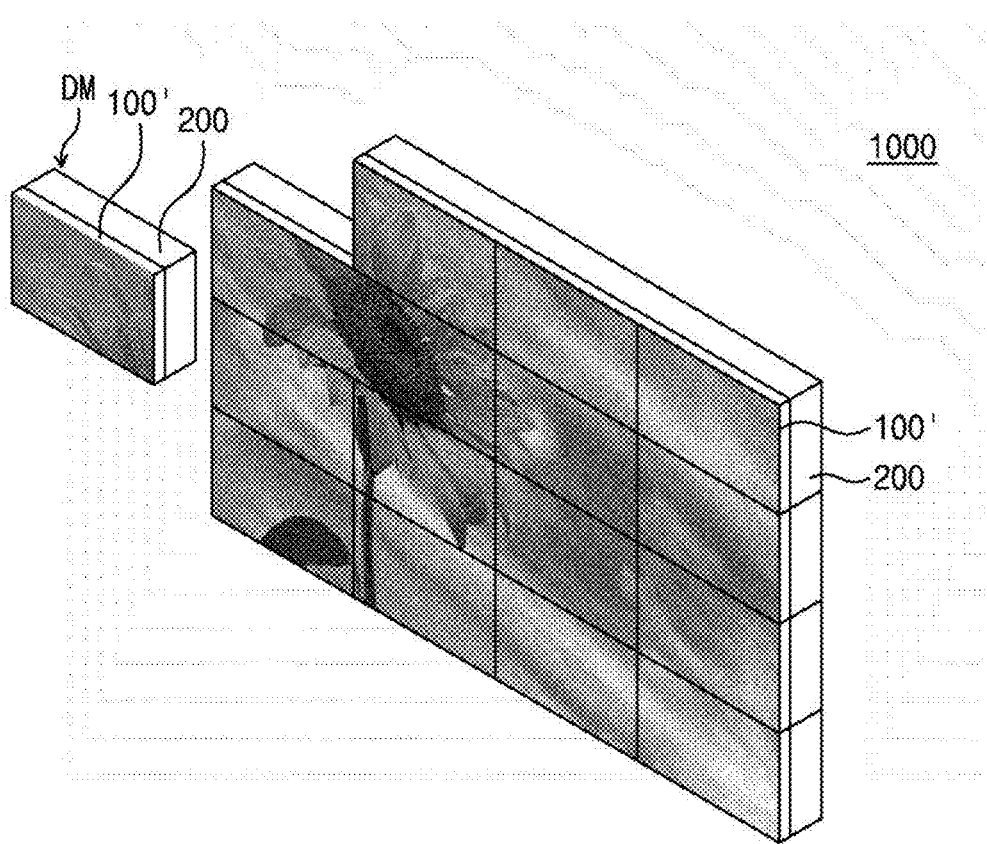
FIG. 21 is a perspective view illustrating a display apparatus according to an exemplary embodiment.

FIG. 21 is a perspective view illustrating a display apparatus according to an exemplary embodiment.

Referring to FIG. 21, a display apparatus 1000 according to the illustrated exemplary invention may include a plurality of modules DM. Each module DM may include a sub-display apparatus 100' and a supporter 200. A plurality of pixels is provided in the sub-display apparatus 100', and each pixel includes a plurality of light emitting diodes as described above. Within each light emitting diode, a red light emitting cell for emitting the red light, a blue light emitting cell for emitting the blue light, and a green light emitting cell for emitting the green light may be provided in one pixel. The sub-display apparatus 100' may be provided with the plurality of light emitting diodes, and the plurality of pixels may be supported by the same supporter 200.

The display apparatus 1000 is provided with the plurality of modules DM, and thus, the display apparatus 1000 may be enlarged.

According to exemplary embodiments, sub-pixels emitting light of different colors including first to third light emitting cells may be disposed in a single light emitting diode to provide a light emitting diode capable of being easily mounted and replaced. Further, areas of the first to third light emitting cells are different from one another, and thus, the light emitting cells of each sub-pixel may be operated at an optimal luminous efficiency, and a display apparatus including the same has high color purity and high color reproducibility.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus, comprising:
a substrate;
a first sub-pixel, a second sub-pixel, and a third sub-pixel disposed on the substrate and configured to emit red light, green light, and blue light, respectively, the first sub-pixel, the second sub-pixel, and the third sub-pixel respectively comprising a first light emitting cell, a second light emitting cell, and a third light emitting cell;
partition walls disposed between the first sub-pixel, the second sub-pixel, and the third sub-pixel, and configured to not transmit light; and
a filler disposed on the first, second, and third sub-pixels, the filler including a first filler disposed in a cavity of the first sub-pixel defined by the partition walls, a second filler disposed in a cavity of the second sub-pixel defined by the partition walls, and a third filler disposed in a cavity of the third sub-pixel defined by the partition walls,
wherein the first, second, and third fillers contact a top surface of the first, second, and third light emitting cells, respectively,
wherein the first filler and the second filler comprise different materials, and the second filler and the third filler comprise the same material, and
wherein a height of each of the first, second, and third light emitting cells is lower than a height of the partition walls, and a difference between the height of the partition walls and the height of each of the first, second, and third light emitting cells is less than 100 μm.

2. The display apparatus of claim 1, wherein the substrate comprises at least one of a printed circuit board including a wiring unit, glass, quartz, or a combination thereof.

3. The display apparatus of claim 1, wherein the second filler and the third filler are integrally formed.

4. The display apparatus of claim 1, wherein the first, second, and third light emitting cells comprise flip chips.

5. The display apparatus of claim 1, wherein the first filler comprises a wavelength converter configured to convert a wavelength of light incident to the wavelength converter.

6. The display apparatus of claim 1, wherein a light exiting surface of each of the first, second, and third light emitting cells includes irregularities.

7. The display apparatus of claim 1, further comprising:
electrodes disposed on the substrate; and
connection portions electrically connecting the first, second, and third light emitting cells to the electrodes,
wherein the first, second, and third light emitting cells are disposed on a front surface of the substrate, the electrodes are disposed on a rear surface of the substrate, and the connection portions pass through the substrate.

8. The display apparatus of claim 1, wherein the partition walls disposed between the first, second, and third light emitting cells are integrally connected to each other.

9. The display apparatus of claim 1, wherein a width of each partition wall increases along a direction towards the substrate.

10. The display apparatus of claim 1, wherein a ratio of an area occupied by the partition walls to a planar area of the substrate is 0.5 to 0.99.

11. The display apparatus of claim 1, wherein the height of the partition walls is 15 µm to 115 µm.

12. The display apparatus of claim 1, wherein the first, second, and third light emitting cells are configured to emit red light, green light, and blue light, respectively, and wherein a distance between the first light emitting cell and the second light emitting cell and a distance between the first light emitting cell and the third light emitting cell are the same.

13. The display apparatus of claim 12, wherein the distance between the first light emitting cell and the second light emitting cell is different from a distance between the first light emitting cell and a third light emitting cell of an adjacent pixel.

14. The display apparatus of claim 13, wherein the first, second, and third light emitting cells are provided in each pixel, and wherein distances between the first, second, and third light emitting cells in a first pixel are shorter than distances between any one of the first, second, and third light emitting cells in the first pixel and any one of light emitting cells in a second pixel adjacent to the first pixel.

15. The display apparatus of claim 1, wherein the first, second, and third light emitting cells are arranged substantially in a triangular shape.

16. The display apparatus of claim 1, wherein the first, second, and third light emitting cells are arranged along a straight line.

17. The display apparatus of claim 1, further comprising scan lines and data lines connected to the first, second, and third light emitting cells, wherein the first, second, and third light emitting cells are configured to emit light corresponding to data signals input from the data lines, when scan signals are supplied from the scan lines.

18. The display apparatus of claim 1, further comprising a light diffusion plate disposed on the first, second, and third light emitting cells.

19. The display apparatus of claim 18, further comprising a light shielding unit disposed on the partition walls.

20. The display apparatus of claim 18, wherein the light diffusion plate comprises transparent polymer to refract light emitted from the first, second, and third light emitting cells to increase a viewing angle.

21. The display apparatus of claim 1, further comprising a window layer disposed on the partition walls and the first, second, and third light emitting cells.

22. The display apparatus of claim 21, wherein the window layer supports the partition walls and the first, second, and third light emitting cells.

* * * * *